(12) United States Patent
Go et al.

(10) Patent No.: US 7,707,477 B2
(45) Date of Patent: Apr. 27, 2010

(54) CHECKSUM CALCULATION

(75) Inventors: Dominic Go, San Jose, CA (US); Daniel C. Murray, Morgan Hill, CA (US)

(73) Assignee: Apple Inc., Cupertino, CA (US)

( * ) Notice: Subject to any disclaimer, the term of this patent is extended or adjusted under 35 U.S.C. 154(b) by 1138 days.

(21) Appl. No.: 11/238,382

(22) Filed: Sep. 29, 2005

(65) Prior Publication Data

US 2007/0074091 A1    Mar. 29, 2007

(51) Int. Cl.
*H03M 13/00* (2006.01)

(52) U.S. Cl. .................. 714/758; 714/807; 714/809; 708/530

(58) Field of Classification Search .................. 714/758, 714/800, 801, 823, 807, 809; 708/530
See application file for complete search history.

(56) References Cited

U.S. PATENT DOCUMENTS

| 6,070,182 | A | 5/2000 | Rao et al. |
| 6,591,397 | B1 | 7/2003 | Henriksen |
| 2005/0015423 | A1 * | 1/2005 | D'Arcy et al. ............ 708/530 |

OTHER PUBLICATIONS

David A Patterson, et al., "Computer Architecture, A Quantitative Approach," Second Edition, 1990/1996 Morgan Kaufmann Publishers, Inc., 79 pages.

* cited by examiner

*Primary Examiner*—Guy J Lamarre
(74) *Attorney, Agent, or Firm*—Lawrence J. Merkel; Meyertons, Hood, Kivlin, Kowert & Goetzel, P.C.

(57) ABSTRACT

In one embodiment, a checksum generator comprises an N-bit accumulator and a plurality of N-bit 3:2 carry save adders. A first plurality of the plurality of N-bit 3:2 carry save adders are coupled to receive N-bit inputs extracted from an input to the checksum generator, and one of the first plurality has an N-bit input coupled to the output of the accumulator. A second plurality of the plurality of N-bit 3:2 carry save adders have inputs coupled to outputs of the first plurality, and a most significant bit of each carry output of the first plurality is inserted as a least significant bit of the carry output at the input to the second plurality.

19 Claims, 11 Drawing Sheets

CHECKSUM CALCULATION

BACKGROUND

1. Field of the Invention

This invention is related to the field of checksum generation.

2. Description of the Related Art

Checksumming is often used in electronic systems for error detection in the transmission and/or storage of data. For example, packet data communicated on a network between systems may often include a checksum calculated over the packet data. The checksum is based on the number of set, or binary one, bits in the data. Thus, a transmitting system may calculate the checksum over the data being transmitted, and may included the calculated checksum in the transmitted data. A receiving system may use the same algorithm to check that the data (including the checksum) has arrived without error.

Packets that conform to the transport control protocol (TCP) and internet protocol (IP) use a 16 bit checksum calculated over a portion of the IP header (referred to as the "pseudo-header"), the TCP header, and the packet data that is provided subsequent to the TCP header. The checksum is a one's complement sum of the data over which it is calculated, where the data is divided into 16-bit portions for the summing process. Typically, a 26 bit accumulator is used to accumulate the sum (which permits 10 bits of carry over the 16 bit sum, enough to handle the largest non-jumbo packet of 1522 bytes). The 10 bits of carry are then added back into the 16 bit sum, which may produce a single bit of carry, which again is added back into the 16 bit sum. Accordingly, checksum generation requires 3 passes through adder hardware: a first pass to generate the initial 26 bit sum, a second pass to add the 10 bit carry, and a third pass to add the one bit carry.

SUMMARY

In one embodiment, a checksum generator comprises an N-bit accumulator and a plurality of N-bit 3:2 carry save adders. A first plurality of the plurality of N-bit 3:2 carry save adders are coupled to receive N-bit inputs extracted from an input to the checksum generator, and one of the first plurality has an N-bit input coupled to the output of the accumulator. A second plurality of the plurality of N-bit 3:2 carry save adders have inputs coupled to outputs of the first plurality, and a most significant bit of each carry output of the first plurality is inserted as a least significant bit of the carry output at the input to the second plurality.

In another embodiment, a checksum generator comprises an N-bit accumulator and a plurality of N-bit 3:2 carry save adders arranged as a plurality of levels. Each of the plurality of levels includes at least one of the plurality of N-bit 3:2 carry save adders, and a first level of the plurality of levels has inputs coupled to N-bit inputs extracted from an input to the checksum generator and the N-bit output of the accumulator. Inputs at other levels of the plurality of levels are coupled to the outputs of the preceding one or more levels, and a most significant bit of each carry output of a given level of the plurality of levels is inserted as a least significant bit of the carry output at the input to the next level of the plurality of levels.

BRIEF DESCRIPTION OF THE DRAWINGS

The following detailed description makes reference to the accompanying drawings, which are now briefly described.

Figure 1:
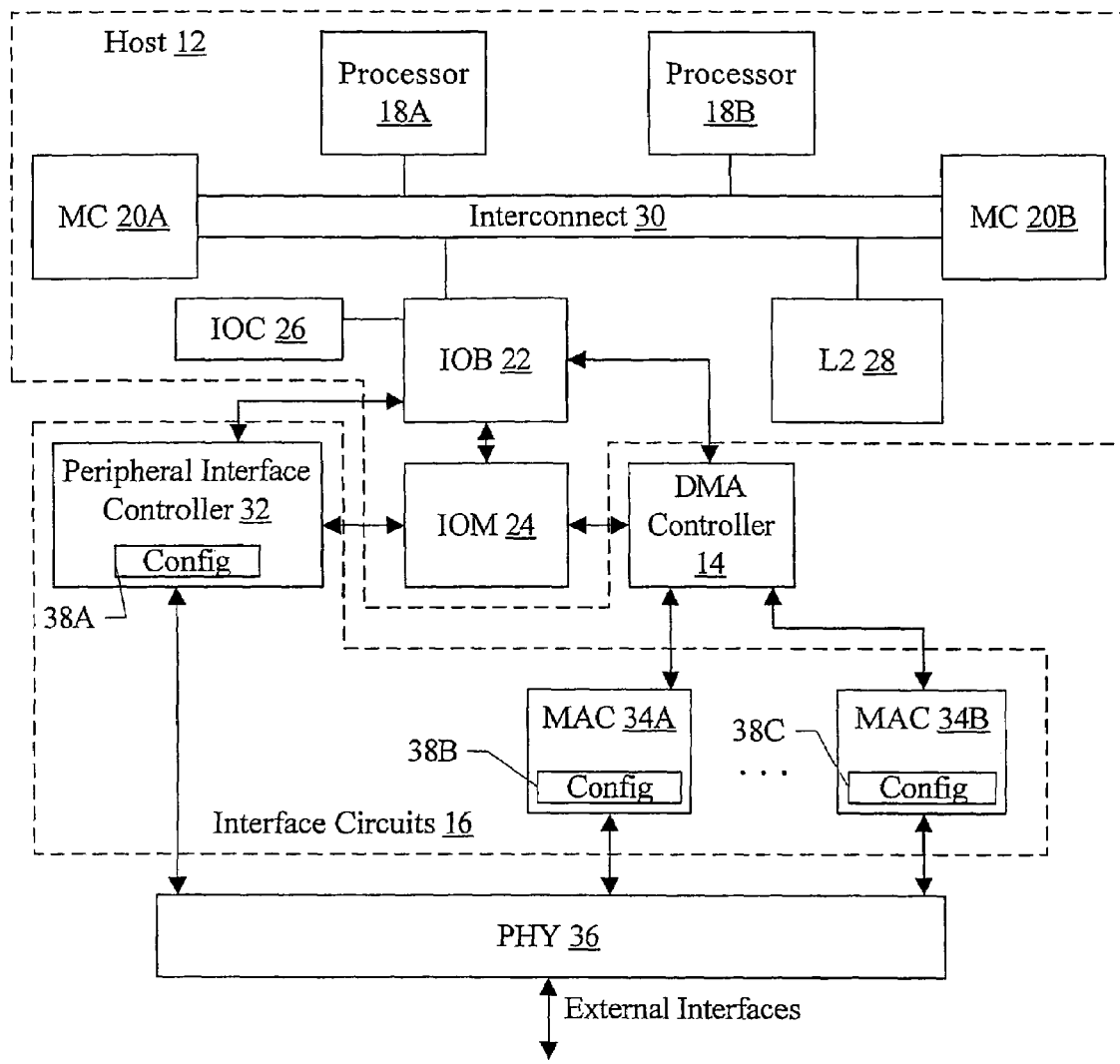
FIG. 1 is a block diagram of one embodiment of a system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Turning now to FIG. 1, a block diagram of one embodiment of a system 10 is shown. In the illustrated embodiment, the system 10 includes a host 12; a DMA controller 14, interface circuits 16, and a physical interface layer (PHY) 36. The DMA controller 14 is coupled to the host 12 and the interface circuits 16. The interface circuits 16 are further coupled to the physical interface layer 36. In the illustrated embodiment, the host 12 includes one or more processors such as processors 18A-18B, one or more memory controllers such as memory controllers 20A-20B, an I/O bridge (IOB) 22, an I/O memory (IOM) 24, an I/O cache (IOC) 26, a level 2 (L2) cache 28, and an interconnect 30. The processors 18A-18B, memory controllers 20A-20B, IOB 22, and L2 cache 28 are coupled to the interconnect 30. The IOB 22 is further coupled to the IOC 26 and the IOM 24. The DMA controller 14 is also coupled to the IOB 22 and the IOM 24. In the illustrated embodiment, the interface circuits 16 include a peripheral interface controller 32 and one or more media access control circuits (MACs) such as MACs 34A-34B. The MACs 34A-34B are coupled to the DMA controller 14 and to the physical interface layer 36. The peripheral interface controller 32 is also coupled to the I/O bridge 22 and the I/O memory 34 (and thus indirectly coupled to the DMA controller 14) and to the physical interface layer 36. The peripheral interface controller 32 and the MACs 34A-34C each include configuration registers 38A-38C. In some embodiments, the components of the system 10 may be integrated onto a single integrated circuit as a system on a chip. In other embodiments, the system 10 may be implemented as two or more integrated circuits.

The host 12 may comprise one or more address spaces. At least a portion of an address space in the host 12 may be mapped to memory locations in the host 12. That is, the host 12 may comprise a memory system mapped to addresses in the host address space. For example, the memory controllers 20A-20B may each be coupled to memory (not shown) comprising the memory locations mapped in the address space. In some cases, the entirety of the address space may be mapped to the memory locations. In other cases, some of the address space may be memory-mapped I/O (e.g. the peripheral interface controlled by the peripheral interface controller 32 may include some memory-mapped I/O).

The DMA controller 14 is configured to perform DMA transfers between the interface circuits 16 and the host address space. Particularly, the DMA transfers may be between memory locations to which the address space is mapped and the interface circuits 16. Additionally, the DMA controller 14 may, in some embodiments, be configured to perform DMA transfers between sets of memory locations within the address space. That is, both the source and destination of such a DMA transfer may be memory locations. The functionality of a data mover may thus be incorporated into the DMA controller 14, and a separate data mover may not be required, in some embodiments. The programming model for the memory-to-memory DMA transfers may be similar to the programming model for other DMA transfers (e.g. DMA descriptors, described in more detail below). A memory-to-memory DMA transfer may also be referred to as a copy DMA transfer.

The DMA controller 14 may be configured to perform one or more operations (or "functions") on the DMA data as the DMA data is being transferred, in some embodiments. The operations may be performed on transfers between the address space and the interface circuits, and may also be performed on copy DMA transfers, in some embodiments. Operations performed by the DMA controller 14 may reduce the processing load on the processors 18A-18B, in some embodiments, since the processors need not perform the operations that the DMA controller 14 performs. In one embodiment, some of the operations that the DMA controller 14 performs are operations on packet data (e.g. encryption/decryption, cyclical redundancy check (CRC) generation or checking, checksum generation or checking, etc.). The operations may also include an exclusive OR (XOR) operation, which may be used for redundant array of inexpensive disks (RAID) processing, for example.

In general, DMA transfers may be transfers of data from a source to a destination, where at least one of the destinations is a memory location or other address(es) in the host address space. The DMA transfers are accomplished without the transferred data passing through the processor(s) in the system (e.g. the processors 18A-18B). The DMA controller 14 may accomplish DMA transfers by reading the source and writing the destination. For example, a DMA transfer from memory to an interface circuit 16 may be accomplished by the DMA controller 14 generating memory read requests (to the IOB 22, in the illustrated embodiment, which performs coherent read transactions on the interconnect 30 to read the data) and transmitting the read data as DMA data to the interface circuit 16. In one embodiment, the DMA controller 14 may generate read requests to read data into the IOM 24 for a DMA transfer through the peripheral interface controller 32, and the peripheral interface controller 32 may read the data from the IOM 24 and transmit the data. A DMA transfer from an interface circuit 16 to memory may be accomplished by the DMA controller 14 receiving data from the interface circuit 16 and generating memory write requests (to the IOB 22, in the illustrated embodiment) to transfer the DMA data to memory. In one embodiment, the peripheral interface controller 32 may write data to the IOM 24, and the DMA controller 14 may cause the data to be written to memory. Thus, the DMA controller 14 may provide DMA assist for the peripheral interface controller 32. Copy DMA transfers may be accomplished by generating memory read requests to the source memory locations and memory write requests to the destination memory locations (including the DMA data from the memory read requests).

The host 12 may generally comprise one or more processors and memory controllers configured to interface to memory mapped into the host 12's address space. The host 12 may optionally include other circuitry, such as the L2 cache 28, to enhance the performance of the processors in the host 12. Furthermore, the host 12 may include circuitry to interface to various I/O circuits and the DMA controller 14. While one implementation of the host 12 is illustrated in FIG. 1, other embodiments may include any construction and interface to the DMA controller 14 and interface circuits 16.

The processors 18A-18B comprise circuitry to execute instructions defined in an instruction set architecture implemented by the processors 18A-18B. Any instruction set architecture may be implemented in various embodiments. For example, the PowerPC™ instruction set architecture may be implemented. Other exemplary instruction set architectures may include the ARM™ instruction set, the MIPS™ instruction set, the SPARC™ instruction set, the x86 instruction set (also referred to as IA-32), the IA-64 instruction set, etc.

The memory controllers 20A-20B comprise circuitry configured to interface to memory. For example, the memory controllers 20A-20B may be configured to interface to dynamic random access memory (DRAM) such as synchronous DRAM (SDRAM), double data rate (DDR) SDRAM, DDR2 SDRAM, Rambus DRAM (RDRAM), etc. The memory controllers 20A-20B may receive read and write transactions for the memory to which they are coupled from the interconnect 30, and may perform the read/write operations to the memory. The read and write transactions may include read and write transactions initiated by the IOB 22 on behalf of the DMA controller 14 and/or the peripheral interface controller 32. Additionally, the read and write transactions may include transactions generated by the processors 18A-18B and/or the L2 cache 28.

The L2 cache 28 may comprise a cache memory configured to cache copies of data corresponding to various memory locations in the memories to which the memory controllers 20A-20B are coupled, for low latency access by the processors 18A-18B and/or other agents on the interconnect 30. The L2 cache 28 may comprise any capacity and configuration (e.g. direct mapped, set associative, etc.).

The IOB 22 comprises circuitry configured to communicate transactions on the interconnect 30 on behalf of the DMA controller 14 and the peripheral interface controller 32. The interconnect 30 may support cache coherency, and the IOB 22 may participate in the coherency and ensure coherency of transactions initiated by the IOB 22. In the illustrated embodiment, the IOB 22 employs the IOC 26 to cache recent transactions initiated by the IOB 22. The IOC 26 may have any capacity and configuration, in various embodiments, and may be coherent. The IOC 26 may be used, e.g., to cache blocks of data which are only partially updated due to reads/writes generated by the DMA controller 14 and the peripheral interface controller 32. Using the IOC 26, read-modify-write sequences may be avoided on the interconnect 30, in some cases. Additionally, transactions on the interconnect 30 may be avoided for a cache hit in the IOC 26 for a read/write generated by the DMA controller 14 or the peripheral interface controller 32 if the IOC 26 has sufficient ownership of the cache block to complete the read/write. Other embodiments may not include the IOC 26.

The IOM 24 may be used as a staging buffer for data being transferred between the IOB 22 and the peripheral interface 32 or the DMA controller 14. Thus, the data path between the IOB 22 and the DMA controller 14/peripheral interface controller 32 may be through the IOM 24. The control path (including read/write requests, addresses in the host address space associated with the requests, etc.) may be between the IOB 22 and the DMA controller 14/peripheral interface controller 32 directly. The IOM 24 may not be included in other embodiments.

The interconnect 30 may comprise any communication medium for communicating among the processors 18A-18B, the memory controllers 20A-20B, the L2 cache 28, and the IOB 22. For example, the interconnect 30 may be a bus with coherency support. The interconnect 30 may alternatively be a point-to-point interconnect between the above agents, a packet-based interconnect, or any other interconnect.

The interface circuits 16 generally comprise circuits configured to communicate on an interface to the system 10 according to any interface protocol, and to communicate with other components in the system 10 to receive communications to be transmitted on the interface or to provide communications received from the interface. The interface circuits may be configured to convert communications sourced in the system 10 to the interface protocol, and to convert communications received from the interface for transmission in the system 10. For example, interface circuits 16 may comprise circuits configured to communicate according to a peripheral interface protocol (e.g. the peripheral interface controller 32). As another example, interface circuits 16 may comprise circuits configured to communicate according to a network interface protocol (e.g. the MACs 34A-34B).

The MACs 34A-34B may comprise circuitry implementing the media access controller functionality defined for network interfaces. For example, one or more of the MACs 34A-34B may implement the Gigabit Ethernet standard. One or more of the MACs 34A-34B may implement the 10 Gigabit Ethernet Attachment Unit Interface (XAUI) standard. Other embodiments may implement other Ethernet standards, such as the 10 Megabit or 100 Megabit standards, or any other network standard. In one implementation, there are 6 MACs, 4 of which are Gigabit Ethernet MACs and 2 of which are XAUI MACs. Other embodiments may have more or fewer MACs, and any mix of MAC types.

Among other things, the MACs 34A-34B that implement Ethernet standards may strip off the inter-frame gap (IFG), the preamble, and the start of frame delimiter (SFD) from received packets and may provide the remaining packet data to the DMA controller 14 for DMA to memory. The MACs 34A-34D may be configured to insert the IFG, preamble, and SFD for packets received from the DMA controller 14 as a transmit DMA transfer, and may transmit the packets to the PHY 36 for transmission.

The peripheral interface controller 32 comprises circuitry configured to control a peripheral interface. In one embodiment, the peripheral interface controller 32 may control a peripheral component interconnect (PCI) Express interface. Other embodiments may implement other peripheral interfaces (e.g. PCI, PCI-X, universal serial bus (USB), etc.) in addition to or instead of the PCI Express interface.

The PHY 36 may generally comprise the circuitry configured to physically communicate on the external interfaces to the system 10 under the control of the interface circuits 16. In one particular embodiment, the PHY 36 may comprise a set of serializer/deserializer (SERDES) circuits that may be configured for use as PCI Express lanes or as Ethernet connections. The PHY 36 may include the circuitry that performs 8b/10b encoding/decoding for transmission through the SERDES and synchronization first-in, first-out (FIFO) buffers, and also the circuitry that logically configures the SERDES links for use as PCI Express or Ethernet communication links. In one implementation, the PHY may comprise 24 SERDES that can be configured as PCI Express lanes or Ethernet connections. Any desired number of SERDES may be configured as PCI Express and any desired number may be configured as Ethernet connections.

In the illustrated embodiment, configuration registers 38A-38C are shown in the peripheral interface controller 32 and the MACs 34A-34B. There may be one or more configuration registers in each of the peripheral interface controller 32 and the MACs 34A-34B. Other configuration registers may exist in the system 10 as well, not shown in FIG. 1. The configuration registers may be used to configure various programmably-selectable features of the peripheral interface controller 32 and the MACs 34A-34B, enable or disable various features, configure the peripheral interface controller 32 and the MACs 34A-34B for operation, etc. In one embodiment described below, the configuration registers may be specified in a control descriptor for on-the-fly reconfiguration of the peripheral interface controller 32 and the MACs 34A-34B.

It is noted that, in various embodiments, the system 10 may include one or any number of any of the elements shown in FIG. 1 (e.g. processors, memory controllers, caches, I/O bridges, DMA controllers, and/or interface circuits, etc.).

Figure 2:
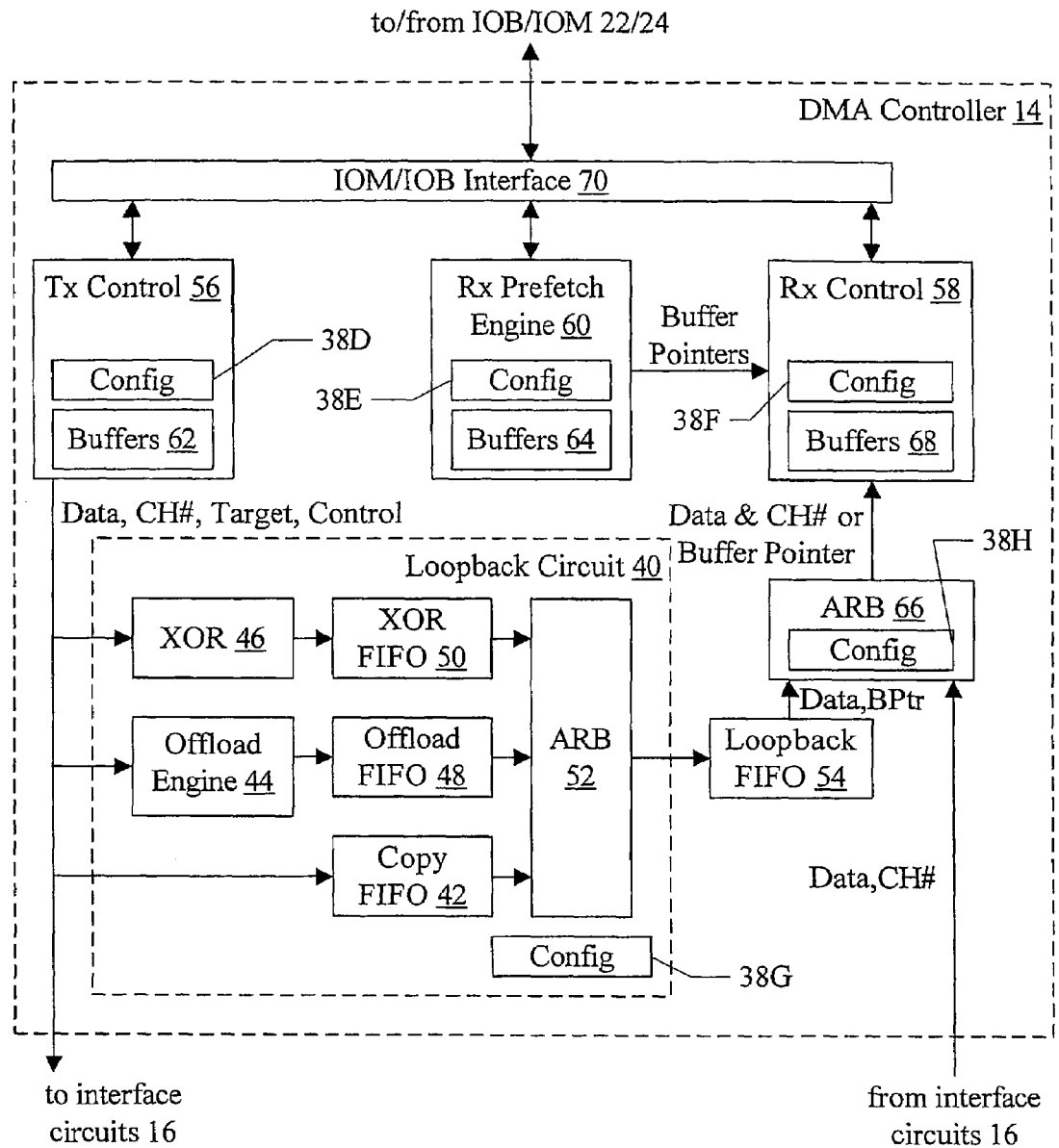
FIG. 2 is a block diagram of one embodiment of a DMA controller shown in FIG. 1.

Turning now to FIG. 2, a block diagram of one embodiment of the DMA controller 14 is shown. For the embodiment of FIG. 2, a descriptor software model for causing DMA transfers will be discussed. In some embodiments, a register-based software model may be supported in addition to or instead of the descriptor model. In a register-based model, each DMA transfer may be programmed into the DMA controller 14, and the DMA controller 14 may perform the DMA transfer. At completion of the transfer, the DMA controller 14 may either interrupt one of the processors 18A-18B or provide status (e.g. in a register within the DMA controller 14) that software may poll to determine when the DMA transfer has completed.

In the descriptor model, software may establish multiple DMA transfers to be performed using descriptor data structures in memory. Generally, a DMA descriptor may comprise a data structure in memory that describes a DMA transfer. The information in the DMA descriptor, for example, may specify the source and target of the DMA transfer, the size of the transfer, and various attributes of the transfer. In some cases, the source or target of the DMA transfer may be implicit. Multiple descriptors may be stored in a descriptor data structure in memory (e.g. in a "descriptor ring"), and the DMA controller 14 may be programmed with the address of the first descriptor in the data structure. The DMA controller 14 may read the descriptors and perform the indicated DMA transfers. A variety of control mechanisms may be used to control ownership of descriptors between software and hardware. For example, the descriptors may include valid bits or enable bits which indicate to the DMA controller 14 that the DMA transfer described in the descriptor is ready to be performed. An interrupt bit in a descriptor may be used to indicate that the DMA controller 14 is to interrupt the processor 18A-18B at the end of a given DMA transfer, or an end-of-transfer bit may be used to indicate that the descriptor describes the last DMA transfer and the DMA controller 14 should pause. Alternatively, the DMA controller 14 may implement descriptor count registers that may be incremented by software to indicate how many descriptors are available for the DMA controller 14 to process. The DMA controller 14 may decrement a descriptor count register to indicate that a prefetch of a descriptor has been generated. In other embodiments, the DMA controller 14 may decrement the descriptor count register to indicate consumption of a descriptor (i.e. performance of the specified DMA transfer). In still other embodiments, the DMA controller 14 may use a separate descriptor processed count register to indicate how many descriptors have been processed or prefetched.

The DMA controller 14 may perform transmit (Tx) DMA transfers and receive (Rx) DMA transfers. Tx DMA transfers have an address space in the host 12 as a source (e.g. memory locations in the memory coupled to the memory controllers 20A-20B). Rx DMA transfers have an address space in the host 12 as a target. Tx DMA transfers may have an interface circuit 16 as a target, or may have another address in the host 12 address space as a target (e.g. for copy DMA transfers). Tx DMA transfers that have host address space targets may use the Rx DMA data path to write the DMA data read from the source address to the target address. A loopback circuit 40 may provide the link between the Tx DMA data path and the Rx DMA data path. That is, a "loopback circuit" comprises circuitry local to the DMA controller that is coupled to receive Tx DMA data from a transmit DMA data path and to provide Rx DMA data on a receive DMA data path. The data provided by the loopback circuit 40 on the receive DMA data path may be the data received from the transmit DMA data path (e.g. for the copy DMA function). In some embodiments, the data provided by the loopback circuit 40 may be data transformed by the loopback circuit 40 from the received data. In some embodiments, the data provided by the loopback circuit 40 may be the data received by the loopback circuit 40, augmented by a result calculated by the loopback circuit 40 on the data (e.g. checksum, CRC data, etc.). Alternatively, the data provided by the loopback circuit 40 may be the data received by the loopback circuit 40 (or the data may not be provided), and the result may be stored in the descriptor for the DMA transfer. Either the transformed data or the result calculated and included with the data or written to the DMA descriptor may generically be referred to herein as the "result".

Thus, in some embodiments, the loopback circuit 40 may be configured to perform one or more operations (or "functions") on the Tx DMA data to produce a result (e.g. transformed DMA data, or a result generated from the data). In the embodiment of FIG. 2, the loopback circuit 40 may include a copy FIFO 42, an offload engine 44, and an exclusive OR (XOR) circuit 46 coupled to the transmit data path. The copy FIFO 42 may store transmit data from the Tx DMA data path for transmission on the Rx DMA data path. Accordingly, the copy FIFO 42 may perform the copy DMA operation. The offload engine 44 may be configured to perform various operations on the DMA data, producing either transformed data or a result separate from the data. The offload engine 44 may be configured to provide any desired set of operations, in various embodiments. In one embodiment, the offload engine 44 may be configured to perform operations that aid in packet processing. For example, various network security protocols have been developed that provide for encryption and/or authentication of packets. Authentication typically includes generating a hash over some or all of the packet. So, the offload engine 44 may be configured to perform encryption/decryption and/or hash functions on packet data in a DMA transfer. Additionally, the offload engine 44 may be configured to perform checksum generation/checking and/or CRC generation/checking. Checksum and/or CRC protection are used in various packet protocols. The XOR circuit 46 may bitwise-XOR DMA data (e.g. DMA data from multiple sources). The XOR circuit 46 may be used, e.g., to support redundant arrays of inexpensive disks (RAID) processing and other types or processing that use XOR functions.

The loopback circuit 40 (and more particularly, the loopback components 42, 44, and 46) may operate on the DMA data during the DMA transfer that provides the DMA data to the loopback circuit 40. That is, the loopback circuit 40 may at least start performing the operation on the DMA data while the Tx DMA transfer provides the remainder of the DMA data. Generally, the result may be written to memory, or more generally to the host address space (e.g. as transformed DMA data, appended to the DMA data, or to a separate result memory location such as a field in the DMA descriptor for the Tx DMA transfer).

The loopback circuit 40 may also include FIFOs for the offload engine 44 and the XOR circuit 46 (offload FIFO 48 coupled to the offload engine 44 and XOR FIFO 50 coupled to the XOR circuit 46). The FIFOs 48 and 50 may temporarily store data from the offload engine 44 and the XOR circuit 46, respectively, until the DMA data may be transmitted on the receive DMA data path. An arbiter 52 is provided in the illustrated embodiment, coupled to the FIFOs 42, 48, and 50, to arbitrate between the FIFOs. The arbiter 52 is also coupled to a loopback FIFO 54, which may temporarily store data from the loopback circuit 40 to be written to the target.

In the illustrated embodiment, the DMA controller 14 comprises a Tx control circuit 56 on the Tx DMA data path, and an Rx control circuit 58 on the Rx DMA data path. The Tx control circuit 56 may prefetch data from the host 12 for transmit DMA transfers. Particularly, the Tx control circuit 56 may prefetch DMA descriptors, and may process the DMA descriptors to determine the source address for the DMA data. The Tx control circuit 56 may then prefetch the DMA data. While the term prefetch is used to refer to operation of the Tx control circuit 56, the prefetches may generally be read operations generated to read the descriptor and DMA data from the host address space.

The Tx control circuit 56 transmits DMA data to the target. The target, in this embodiment, may be either one of the interface circuits 16 or the loopback circuit 40 (and more particularly, one of the copy FIFO 42, the offload engine 44, and the XOR circuit 46 in the illustrated embodiment). The Tx control circuit 56 may identify the target for transmitted data (e.g. by transmitting a target identifier). Alternatively, physically separate paths may be provided between the Tx control circuit 56 and the interface circuits 16 and between the Tx control circuit 56 and loopback components 42, 44, and 46. The Tx control circuit 56 may include a set of buffers 62 to temporarily store data to be transmitted. The Tx control circuit 56 may also provide various control information with the data. The control information may include information from the DMA descriptor. The control information may include, for the loopback circuit 40, the buffer pointer (or pointers) for storing data in the target address space. The control information may also include any other control information that may be included in the DMA descriptor and may be used by the interface circuits 16 or the loopback circuit 14. Examples will be provided in more detail below with respect to the DMA descriptor discussion.

The Rx control circuit 58 may receive DMA data to be written to the host 12 address space, and may generate writes to store the data to memory. In one embodiment, software may allocate buffers in memory to store received DMA data. The Rx control circuit 58 may be provided with buffer pointers (addresses in the host address space identifying the buffers). The Rx control circuit 58 may use the buffer pointer to generate the addresses for the writes to store the data. An Rx prefetch engine 60 may be provided to prefetch the buffer pointers for the Rx control circuit 58. The Rx prefetch engine 60 is coupled to provide the buffer pointers to the Rx control circuit 58. The Rx prefetch engine 60 may include a set of buffers 64 to temporarily store prefetched buffer pointers for use by the Rx prefetch engine 60. Similarly, the Rx control circuit 58 may include a set of buffers 68 to temporarily store received DMA data to be written to memory.

Figure 12:
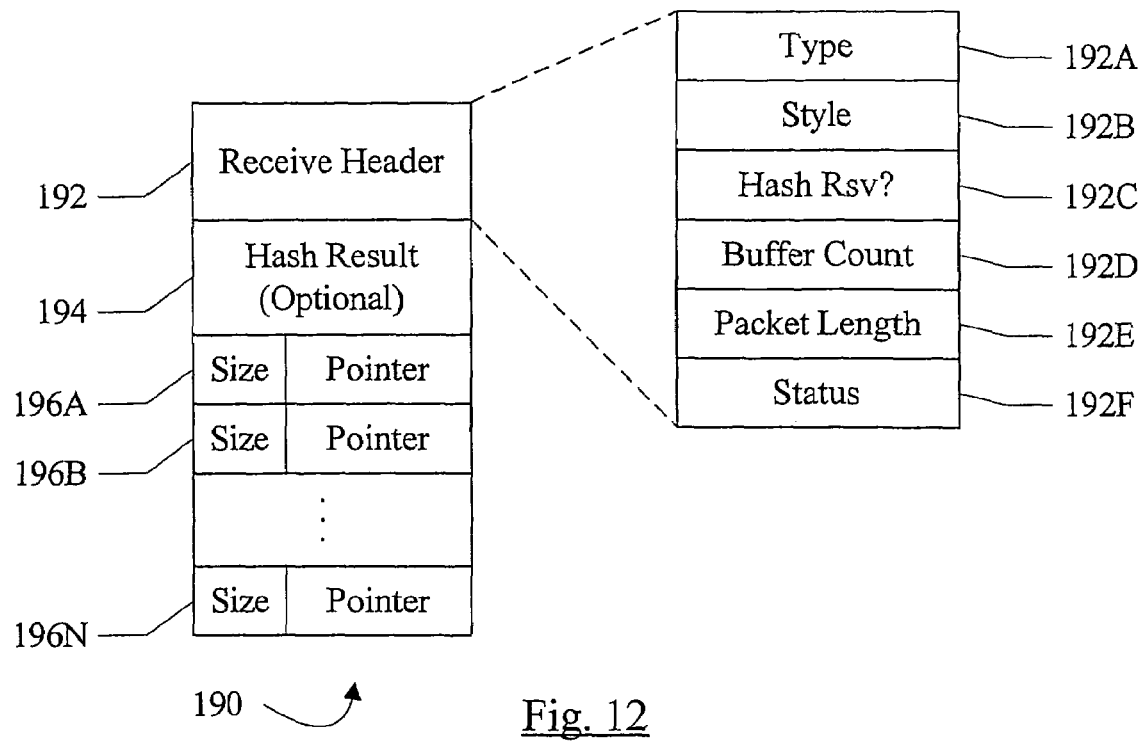
FIG. 12 is a block diagram illustrating one embodiment of a receive DMA descriptor.

In one embodiment, the Rx control circuit 58 may be configured to generate descriptors for received DMA data. That is, rather than having software create DMA descriptors for received DMA data, software may allocate buffers to store the DMA data and may provide the buffer pointers. The Rx control circuit 58 may store received DMA data in the allocated buffers, and may create the descriptors for the DMA transfers. The descriptors created by the Rx control circuit 58 may include one or more buffer pointers to one or more buffers storing the received DMA data, as well as other information describing the DMA transfer. An exemplary embodiment of the receive DMA descriptor is shown in FIG. 12 and described in more detail below. Since the Rx control circuit 58 creates the descriptors for received DMA data, the descriptors may be more efficient than those created by software. For example, software may have to create receive DMA descriptors capable of receiving the largest possible DMA transfer (or multiple descriptors may be required for larger transfers), and may have to allocate enough buffers for storing the largest possible DMA transfer. On the other hand, descriptors created by the Rx control circuit 58 may be large enough for the actual transfer received (and may consume enough buffers to store the received data), but not necessarily larger.

In the illustrated embodiment, the Rx control circuit 58 may receive the DMA data from an arbiter 66, which is coupled to the loopback FIFO 54 and to receive DMA data from the interface circuits 16 as well. The arbiter 66 may arbitrate between the loopback FIFO 54 and the received DMA data from the interface circuits 16 to transfer data to the Rx control circuit 58.

The arbiters 52 and 66 may implement any desired arbitration scheme. For example, a priority-based scheme, a round-robin scheme, a weighted round-robin scheme, or combinations of such schemes may be used. In some embodiments, the arbitration scheme may be programmable. The arbitration scheme(s) implemented by the arbiter 52 may differ from the scheme(s) implemented by the arbiter 66.

The Tx control circuit 56, the Rx prefetch engine 60, and the Rx control circuit 58 are coupled to an IOM/IOB interface unit 70 in the illustrated embodiment. The IOM/IOB interface unit 56 may communicate with the IOB 22 and the IOM 24 on behalf of the Tx control circuit 56, the Rx prefetch engine 60, and the Rx control circuit 58. The IOM/IOB interface unit 70 may receive read and write requests from the Tx control circuit 56, the Rx prefetch engine 60, and the Rx control circuit 58 and may communicate with the IOB 22 and the IOM 24 to satisfy those requests.

Particularly, the IOM/IOB interface unit 70 may receive read requests for descriptors and for DMA data from the Tx control circuit 56 and read requests to the memory storing buffer pointers from the Rx prefetch engine 60, and may convey the requests to the IOB 22. The IOB 22 may indicate which IOM 24 entry stores a cache line of data including the requested data (subsequent to reading the data from the host address space or the IOC 26, for example, or the data may already be in the IOM 24 from a previous request), and the IOM/IOB interface 70 may read the data from the IOM 24 and provide it to the Tx control circuit 56 or the Rx prefetch engine 60. The IOM/IOB interface unit 70 may also receive write requests from the Rx control circuit 58, and may store the write data in the IOM 24 (at an entry allocated for the write data by the IOB 22). Once a cache line of data is accumulated in the IOM 24 (or the DMA transfer completes, whichever comes first), the IOM/IOB interface unit 70 may inform the IOB 22 and may provide an address to which the cache line is to be written (derived from the buffer pointer to the buffer being written).

In one embodiment, the DMA controller 14 may support various channels for transmit DMA transfers and receive DMA transfers. Any number of channels may be supported, in various embodiments. For example, in one implementation, 20 transmit DMA channels may be provided and 64 receive DMA channels may be provided. Each channel may be an independent logical data path from a source to a destination. The channels may be assigned as desired by software.

More particularly, each transmit channel may assigned to one of the interface circuits 16 or one of the loopback component circuits 42, 44, or 46. Not all transmit channels need be in use (that is, some transmit channels may be disabled). The Tx control circuit 56 may prefetch DMA descriptors and DMA data on a per-channel basis. That is, the Tx control circuit 56 may independently generate prefetches for each channel that has DMA descriptors available for processing. The Tx control circuit 56 may select among the generated prefetches to transmit read requests to the IOM/IOB interface unit 70.

Each receive channel may be assigned to one of the interface circuits 16. Not all receive channels need be in use (that is, some receive channels may be disabled). The Rx control circuit 58 may receive the channel number with received data. The loopback circuit 40 may supply a buffer pointer from the DMA descriptor for the DMA, and the Rx control circuit 58 may use the buffer pointer to write the DMA data to the host address space. The interface circuits 16 may be programmable with the assigned channels, or may employ packet filtering to determine a channel. The interface circuits 16 may supply the channel number with the DMA data, and the Rx control circuit 58 may use a buffer pointer provided from the Rx prefetch engine 60 for the channel to write the DMA data to the host address space.

The DMA controller 14 may include various configuration registers 38D-38H as shown in FIG. 2. The configuration registers 38D-38H may be programmable with to enable/disable various programmable features of the DMA controller 14 and/or to configure the programmable features, as mentioned above. For example, the configuration registers 38D in the Tx control circuit 56 may include addresses of descriptor rings for each channel, as well as descriptor counts indicating the number of available descriptors. The configuration registers 38D may further include assignments of transmit channels to interface circuits 16 and component loopback functions. Various other per-channel configuration and non-channel-related configuration may be stored in configuration registers 38D. Similarly, configuration registers 38E may store addresses of buffer pointer rings for each interface circuit 16, buffer ring counts, etc. as well as various non-channel related configuration. The configuration registers 38F may store various receive DMA configuration. The configuration registers 38G may store configuration for the loopback circuit 40 as a whole, as well as configuration for each component circuit as desired. The configuration registers 38G may also store configuration for the arbiter 52 (e.g. selecting the arbitration scheme, programming configuration for the selected arbitration scheme). The configuration registers 38H may store arbitration configuration for the arbiter 66.

It is noted that, while the Tx control circuit 56 implements prefetch to obtain descriptors and DMA data, other embodiments may not implement prefetch. Thus, in general, there may be a Tx engine 56 or Tx control circuit 56 configured to perform transmit DMA transfers (and DMA transfers to the loopback circuit 40).

It is noted that the present description refers to buffers and buffer pointers for DMA transfers. A buffer that is pointed to by a buffer pointer (as opposed to hardware storage buffers such as 62, 64, and 68) may comprise a contiguous memory region. Software may allocate the memory region to store DMA data (either for transmission or as a region to receive DMA data). The buffer pointer may comprise an address of the memory region in the host address space. For example, the buffer pointer may point to the base of the memory region or the limit of the memory region.

Figure 3:
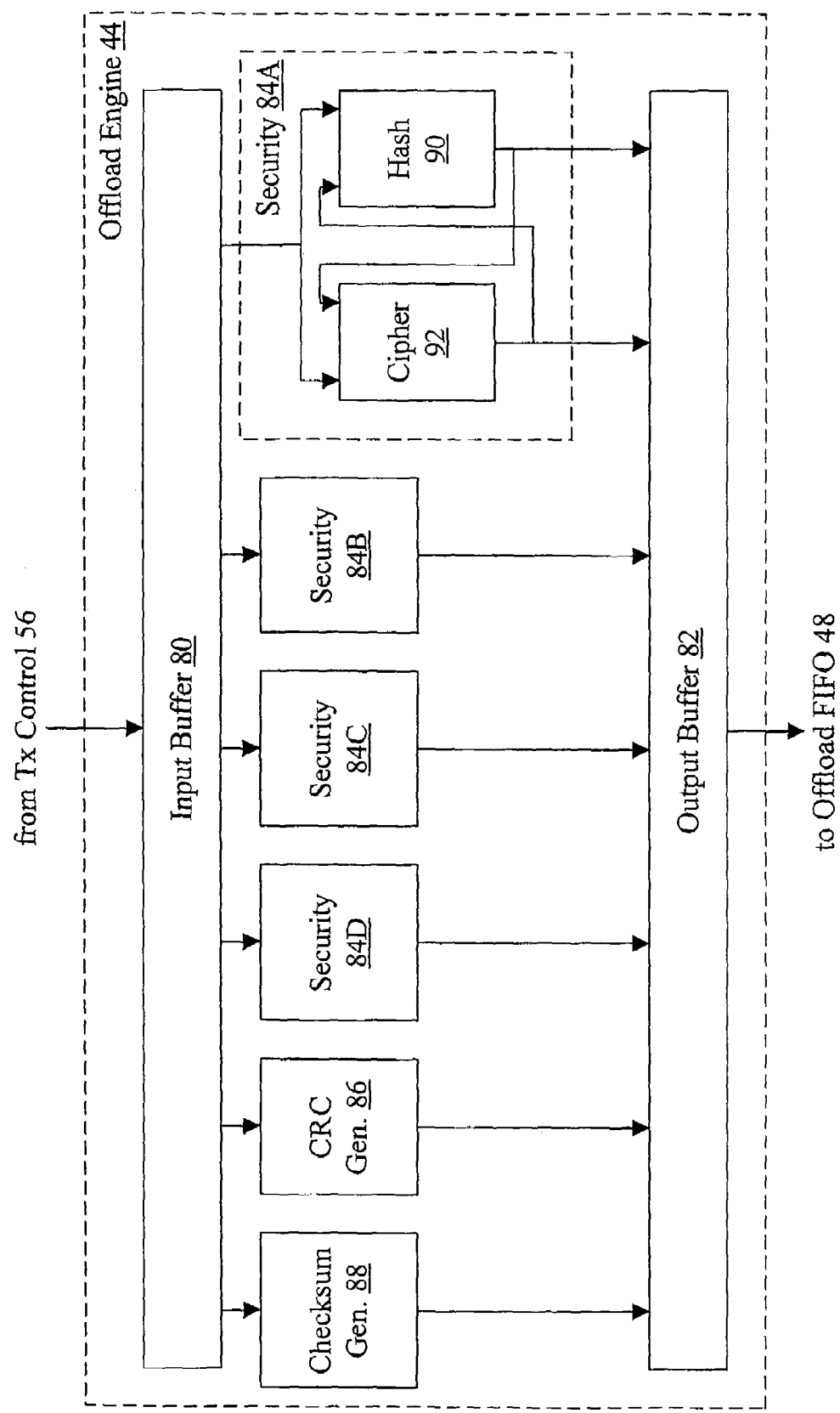
FIG. 3 is a block diagram of one embodiment of an offload engine shown in FIG. 2.

Turning now to FIG. 3, a block diagram of one embodiment of the offload engine 44 is shown. In the illustrated embodiment, the offload engine 44 includes an input buffer 80, an output buffer 82, a set of security circuits 84A-84D, a CRC generator 86, and a checksum generator 88. The input buffer 80 is coupled to the Tx control circuit 56 and to the security circuits 84A-84D, the CRC generator 86, and the checksum generator 88. The output buffer 82 is coupled to the security circuits 84A-84D, the CRC generator 86, and the checksum generator 88. The output buffer 82 is coupled to the offload FIFO 48 as well. The security circuit 84A is shown in greater detail in FIG. 3 for one embodiment, and the security circuits 84B-84D may be similar. The security circuit 84A includes a hash circuit 90 and a cipher circuit 92. The hash circuit 90 and the cipher circuit 92 are both coupled to the input buffer 80 and the output buffer 82. Additionally, the output of the hash circuit 90 is coupled as an input to the cipher circuit 92 and the output of the cipher circuit 92 is coupled as an input to the hash circuit 90 in a "butterfly" configuration.

The security circuits 84A-84D may be configured to perform various operations to offload security functions of packet processing. Particularly, the security circuits 84A-84D may be configured to perform encryption/decryption (collectively referred to as ciphering, or cipher functions) and hashing functions that are included in various secure packet specifications (e.g. the secure internet protocol (IPSec) or secure sockets layer (SSL)).

Typically, communicating using a secure packet protocol includes a negotiation session in which the endpoints communicate the protocols that they can use, the security schemes that the support, type of encryption and hash, exchange of keys or certificates, etc. Then there is a bulk transfer phase using the agreed-upon protocols, encryption, etc. During the bulk transfer, packets may be received into the host 12 (e.g. via the receive DMA path from one of the interface circuits 16). Software may consult data structures in memory to obtain the keys, encryption algorithms, etc., and prepare a DMA transfer through the offload engine 44 to decrypt and/or authenticate the packet. Similarly, software may prepare a packet for secure transmission and use a DMA transfer through the offload engine 44 to encrypt and/or authenticate the packet.

The hash circuit 90 may implement various hash functions that may be used in authentication of packets. Typically, the hash is computed over at least a portion of the packet, and the hash result is included in the packet. When the packet is received at its destination, the hash may be checked to detect if any fields in the packet have been changed (and thus detect if the packet was modified in transit from its source). In one embodiment, the following hash functions may be supported in the hash circuit 90: Message Digest 5 (MD-5)/secure hash algorithm-1 (SHA-1), and hashed message authentication code (HMAC). Other embodiments may implement SHA-2. Other embodiments may implement any other set of hash functions, including subsets or supersets of the above functions and other functions.

The cipher circuit 92 may be configured to perform cipher functions. Depending on the secure packet specification, the cipher function may be applied to at least a portion of the packet, possibly including the hash data. Any set of cipher functions may be supported in various embodiments. For example, in one embodiment, the following encryption/decryption algorithms may be implemented in the cipher circuit 92: data encryption standard (DES), triple data encryption standard (3DES), advanced encryption standard (AES), Kasumi, alleged Ron's code 4 (ARC4) and/or Ron's code 4 (RC4).

In some cases, if both authentication and cipher functions are being used, the encryption is performed first when preparing a packet for transmission, and then authentication hashing is performed over the encrypted data (e.g. IPSec). In other cases, the authentication hash is performed first, and encryption of the packet (including the hash data) is performed second (e.g. SSL). In either case, the authentication hash and decryption are performed in the opposite order on a received packet.

The security circuits 84A-84D may support either order of ciphering and hashing of data in a single DMA transfer, via the butterfly connection between the circuits 90 and 92. That is, if ciphering is to be performed first, the data provided to the security circuit 84A may be routed to the cipher circuit 92, and the output of the cipher circuit 92 may be routed to the input of the hash circuit 90 to compute the hash function on the encrypted (or decrypted) data. If hashing is to be performed first, the data provided to the security circuit 84A may be routed to the hash circuit 90, and the output of the hash circuit 90 may be routed to the input of the cipher circuit 92. The security circuits 84A-84D also support performing only the hash or only the cipher function in a given DMA transfer. Control information from the DMA descriptor for the DMA transfer directed to the security circuits 84A-84D may control the routing of data through the security circuits 84A-84D.

The illustrated embodiment shows 4 security circuits 84A-84D. Other embodiments may include any number of security circuits, including one security circuit. In one embodiment, the security circuits 84A-84D may be clocked at double the frequency of the system clock used in the system 10 and may receive two operations per system clock cycle (one performed in the first half of the system clock cycle and the other in the second half of the system clock cycle). Thus, there may be 8 logical security circuits that may be selected by software to perform security functions.

The CRC generator 86 may be configured to generate CRC data over the data provided in a DMA transfer specifying CRC generation. The CRC generation may also be used to check CRC data from a received packet. For example, the CRC data generated in the CRC generator 86 may be compared to the corresponding CRC data in the received packet. Alternatively, the CRC data in the received packet may be included in the DMA transfer through the CRC generator 86, and the result may be checked against a predetermined value to detect error in the received packet. In some embodiments, there may be more than one CRC generator 86. Furthermore, the CRC generator(s) 86 may be clocked at twice the system clock frequency, similar to the security circuits 84A-84D, to provide more logical CRC generators than are physically provided in the offload engine 44. In one particular embodiment, there may be 4 of the CRC generators 86, clocked at twice the system clock frequency, to provide an equal number of logical units (8) to the security circuits 84A-84D.

The checksum generator 88 may be configured to generate a checksum over the data provided in a DMA transfer that specifies checksum generation. The checksum generation may also be used to check the checksum data from a received packet. For example, the checksum data generated in the checksum generator 88 may be compared to the corresponding checksum in the received packet. Alternatively, the checksum data in the received packet may be included in the DMA transfer through the checksum generator 88, and the result may be checked against a predetermined value to detect error in the received packet. In some embodiments, there may be more than one checksum generator 88.

The input buffer 80 may temporarily store data provided by the Tx control circuit 56 until the target circuit 84A-84D, 86, or 88 may operate upon the data. The circuits 84A-84D, 86, and 88 may output data to the output buffer 82 to be written to the offload FIFO 48. In other embodiments, the input buffer 80 and/or the output buffer 82 may not be included.

Figure 4:
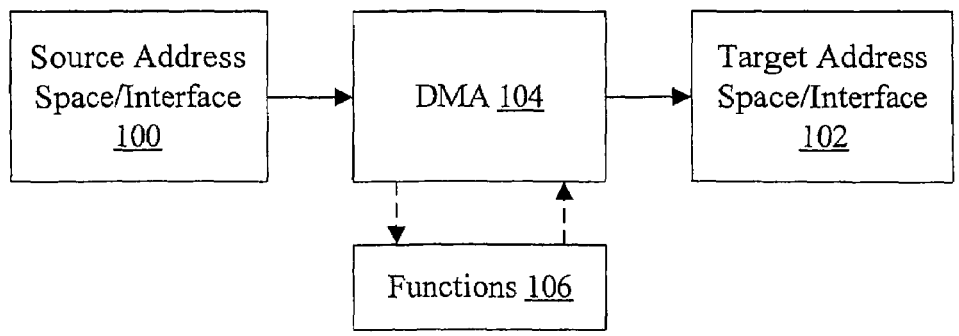
FIG. 4 is a block diagram of one embodiment of DMA in the system of FIG. 1.

FIG. 4 is a block diagram illustrating one embodiment of a model for DMA that may be implemented in one embodiment of the system 10. As mentioned previously, a DMA transfer may occur from a source address space or interface (block 100) to a destination address space or interface (block 102). The DMA transfer is represented by the block 104 in FIG. 4. Optionally, a DMA transfer may include performance of one or more operations, or functions, (block 106) on the DMA data to produce a result. The result is passed back to the DMA block 104 and may be provided to the target address space. In some cases, the result may be transformed DMA data that may be written to the target address space. In other cases, the result may be separate from the DMA data and may augment the DMA data (e.g. appended to the end of the DMA data) or may be stored in a separate location (e.g. in the DMA descriptor for the DMA transfer).

FIG. 4 may illustrate a single DMA transfer, in some cases. In other cases, multiple DMA transfers may be used to complete the model of FIG. 4. For example, the functions 106 may be performed by the loopback circuit 40 (or components thereof, for the embodiment of FIG. 2). Thus, in the illustrated embodiment, if a function is desired to be performed on a DMA transfer that targets an interface circuit 16, two DMA transfers may be performed. A first DMA transfer may be from a source address space to a target address space, specifying the desired functions to be performed. Subsequently, a second DMA transfer may be performed, using the target address space of the first DMA transfer as the source and the desired interface circuit as a target.

For example, a packet may be prepared by software for transmission via one of the MACs 34A-34B, and the packet may be stored in memory in the host 12. Secure transmission using encryption and/or hashing may be desired, and so software may establish a first DMA transfer from the first memory region to a second memory region in the host 12, and the first DMA transfer may specify encryption and/or hashing in the offload engine 44. Software may also prepare a second DMA transfer from the second memory region to the target MAC 34A-34B. Similarly, a packet may be received as a DMA into memory in the host 12, and software may establish a DMA transfer through the offload engine 44 to check the hash and/or decrypt the packet.

Other embodiments may permit functions to be applied as data is transmitted to an interface circuit 16. In one embodiment, for example, partial checksum generation may be supported in the IOB 22 for generating the checksum included in the TCP header of TCP packets. When a DMA transfer is specified for such a packet, the IOB 22 may accumulate that packet data in the IOM 24 and may generate the partial checksum for each cache line. The final checksum may be generated in the DMA controller 14, using the partial checksums for each cache line from the IOB 22 and the data over which the partial checksums were not calculated, and the DMA controller 14 may insert the calculated checksum into the TCP header. Other embodiments may permit the output of the loopback circuit 40 to be routed directly to the interface circuits 16 as part of the single DMA transfer in which the functions are performed and the data is transmitted. Furthermore, other embodiments may permit the data from the Rx DMA data path to be input to the loopback circuit 40 to perform functions on the received DMA data during the receive DMA transfer.

Figure 5:
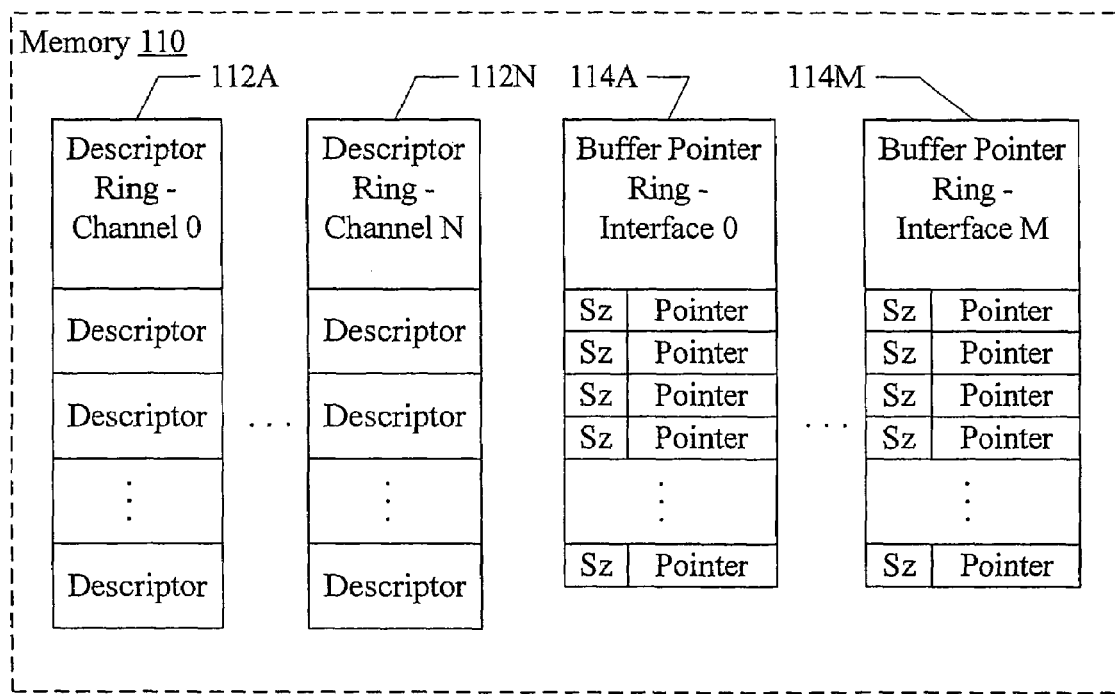
FIG. 5 is a block diagram of one embodiment of descriptor rings and buffer pointer rings.

Turning next to FIG. 5, a block diagram of a memory region 110 storing descriptor data structures and buffer pointer data structures is shown. In the embodiment of FIG. 5, the descriptor data structures include a set of descriptor rings 112A-112N. There may be one descriptor ring for each DMA channel supported by the DMA controller 14 (e.g. channel 0 to channel N in FIG. 5). That is, there may be a one-to-one correspondence between DMA channels and descriptor rings, and the DMA transfers for a given DMA channel may have corresponding descriptors in the descriptor ring 112A-112N assigned to that channel. Additionally, in the embodiment of FIG. 5, the buffer pointer data structures may including a set of buffer pointer rings 114A-114M. There may be a buffer pointer ring per interface circuit 16 (e.g. interface circuits 0 to M in FIG. 5, where M+1 may be the number of interface circuits 16). That is, there may be a one-to-one correspondence between interface circuits and descriptor rings, and the buffer pointers used for DMA's received on that interface may be taken from the buffer pointer ring 114A-114M assigned to that interface circuit.

Each descriptor ring 112A-112N may comprise a set of descriptors for the corresponding DMA channel. For transmit DMA channels, the descriptors may be processed in the order included within the ring, from the first descriptor in the ring to the last, and then wrapping around to the first descriptor in the ring after the last descriptor has been processed. Thus, at a given point in time, any descriptor in the ring may be viewed as the "current descriptor" that is the next to be processed. Software may control the number of descriptors that are available for processing on the DMA channel in a variety of fashions, as mentioned above. Accordingly, if there are descriptors available on a given transmit DMA channel (in the corresponding descriptor ring), the DMA controller 14 may perform the specified DMA transfers (arbitrating for resources with other DMA channels). For receive DMA channels in the present embodiment, the descriptors in the corresponding descriptor ring may be consumed as DMA transfers are received on that channel. The DMA controller 14 may write the current descriptor with the buffer pointer(s) used to store the received DMA data, as well as other information related to the DMA transfer such as transfer status information.

Other embodiments may use other data structures (e.g. linked lists of descriptors). The base address of each descriptor ring 112A-12N may be provided to the DMA controller 14 (e.g. programmed into the configuration registers 38D or 38F, depending on whether the channel is a transmit or receive channel). Other attributes of the descriptor ring 112A-112N may be programmed as well (e.g. extent). In some embodiments, the descriptors in a given ring may be of a fixed size, so that a given descriptor may be at a fixed offset from the base address of the ring. In other embodiments, descriptors may be variable in size. In still other embodiments, the descriptors may be fixed size or variable size, depending on a programmable attribute in the configuration registers 38D or 38F. The attribute may be programmable on a channel by channel basis, or may be programmed for the channels as a whole.

Each buffer pointer ring 114A-114M comprises buffer pointers pointing to buffers in memory allocated by software for use to store DMA data from Rx DMA transfers from the corresponding interface. Similar to the descriptor rings 112A-112N, software may make the buffer pointers in the buffer pointer rings 114A-114M available to the DMA controller 14 in any desired fashion. The base address of the buffer pointer ring for each interface may be programmed into the DMA controller 14 (e.g. in the configuration registers 38E in the Rx prefetch engine 60, in the embodiment of FIG. 2), and at any given time, one of the buffer pointers in the buffer pointer ring may be the next to be consumed for the corresponding interface.

By providing the buffer pointer rings 114A-114M associated with the interface circuits, rather than the DMA channels, the software may allocate buffers to the smaller number of interface circuits rather than the larger number of DMA channels, in some embodiments. The allocation of memory may, in some cases, be more efficient. Interface circuits that are handling more traffic may be allocated more buffers, without software having prior knowledge of what channels that traffic will be received on. As DMA data is received from a given interface, the data may be stored in the buffers allocated to that interface and the buffer pointers may be written to the descriptor for the channel on which the DMA data is received. The descriptor may be in one of the descriptor rings 112A-112N, depending upon which receive DMA channel is associated with the DMA transfer.

The buffer pointer rings 114A-114M may also include a size field (Sz in FIG. 5) for each buffer pointer. The size field may indicate the size of the buffer pointed at by the corresponding buffer pointer. Accordingly, software may allocate buffers of different sizes based on, e.g., the amount of memory available, the expected size of DMA transfers on a given interface, etc.

Figure 6:
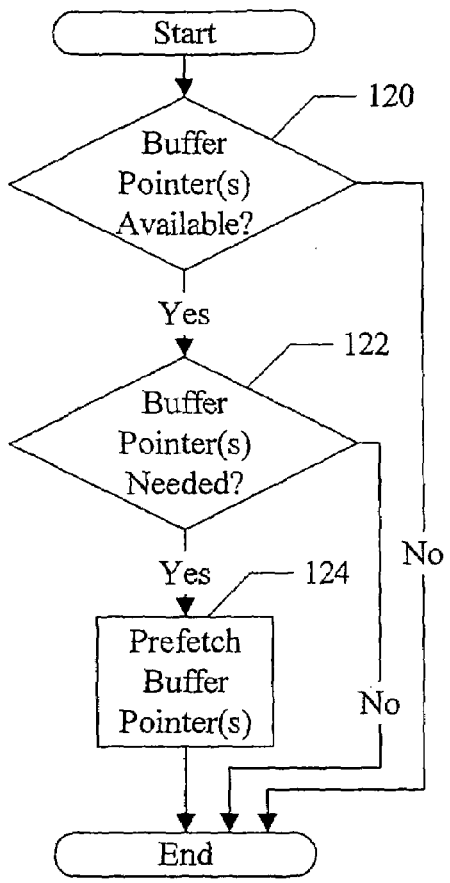
FIG. 6 is a flowchart illustrating operation of one embodiment of a receive prefetch engine shown in FIG. 2.

Turning now to FIG. 6, a flowchart is shown illustrating operation of one embodiment of the Rx prefetch engine 60 for a given interface circuit. The Rx prefetch engine 60 may include circuitry that implements the operation shown in FIG. 6 for each interface circuit, operating in parallel and independently. While blocks are shown in a particular order in FIG. 6 for ease of understanding, the blocks may be implemented in parallel in combinatorial logic circuitry that implements the operation shown in FIG. 6. In some embodiments, one or more of the blocks or the flowchart as a whole may be pipelined over multiple clock cycles.

The Rx prefetch engine 60 may determine if there are buffer pointers available for the interface circuit (in the buffer pointer ring 114A-114M corresponding to the interface circuit) (decision block 120) and if buffer pointers are needed for the interface circuit (decision block 122). If at least one buffer pointer is available and needed (decision blocks 120 and 122, "yes" leg), the Rx prefetch engine 60 may generate a prefetch request to read the buffer pointer(s) from the buffer pointer ring 114A-114M in the host 12's memory (block 124).

Buffer pointers may generally be "available" if there are buffer pointers in the corresponding buffer pointer ring 114A-14M that have not been prefetched by the Rx prefetch engine 60. The buffer pointers may be inserted into the buffer pointer ring 114A-14M by software, and software may indicate that they are available in any of the previously mentioned fashions (e.g. using valid bits in the buffer pointer ring entries, incrementing a buffer pointer ring count similar to the DMA descriptor count described above, etc.). Buffer pointers may be viewed as "needed" in a variety of fashions as well. For example, if a receive DMA channel is enabled and there are no buffer pointers prefetched for the channel, a buffer pointer may be "needed". In some embodiments, the Rx prefetch engine 60 may be programmable to indicate a number of buffer pointers that should be prefetched, or a minimum and maximum number of buffer pointers that should be prefetched. The Rx prefetch engine 60 may generate prefetch requests for buffer pointers to attempt to prefetch the programmed number of buffer pointers.

As mentioned above, the operation of FIG. 6 may be performed in parallel for each enabled interface circuit. If more than one prefetch request is generated concurrently, the Rx prefetch engine 60 may also include circuitry to select among the prefetch requests. For example, in one embodiment, the Rx prefetch engine 60 may implement a fixed priority scheme among the prefetch requests. In other embodiments, the Rx prefetch engine 60 may select the prefetch request corresponding to an interface circuit for which the fewest buffer pointers are currently prefetched and ready. As another example, the Rx prefetch engine 60 may weight the requests based on which interface circuit has the largest difference between the number of currently prefetched buffer pointers and the desired number of buffer pointers for that interface circuit. Round-robin or priority based selection mechanisms may also be used, and these mechanisms may include programmable weighting among the interface circuits, if desired. Starvation prevention mechanisms such as per-interface timeouts may also be used to ensure that pointers are prefetched for each interface circuit.

The Rx prefetch engine 60 may be informed by the IOM/IOB interface circuit 70 when prefetched buffer pointers are available in the IOM 24 to be read. The Rx prefetch engine 60 may, in some embodiments, read some or all of the pointers from the IOM 24 into the buffers 64 and may provide the prefetched buffer pointers to the Rx control circuit 58 as needed.

Figure 7:
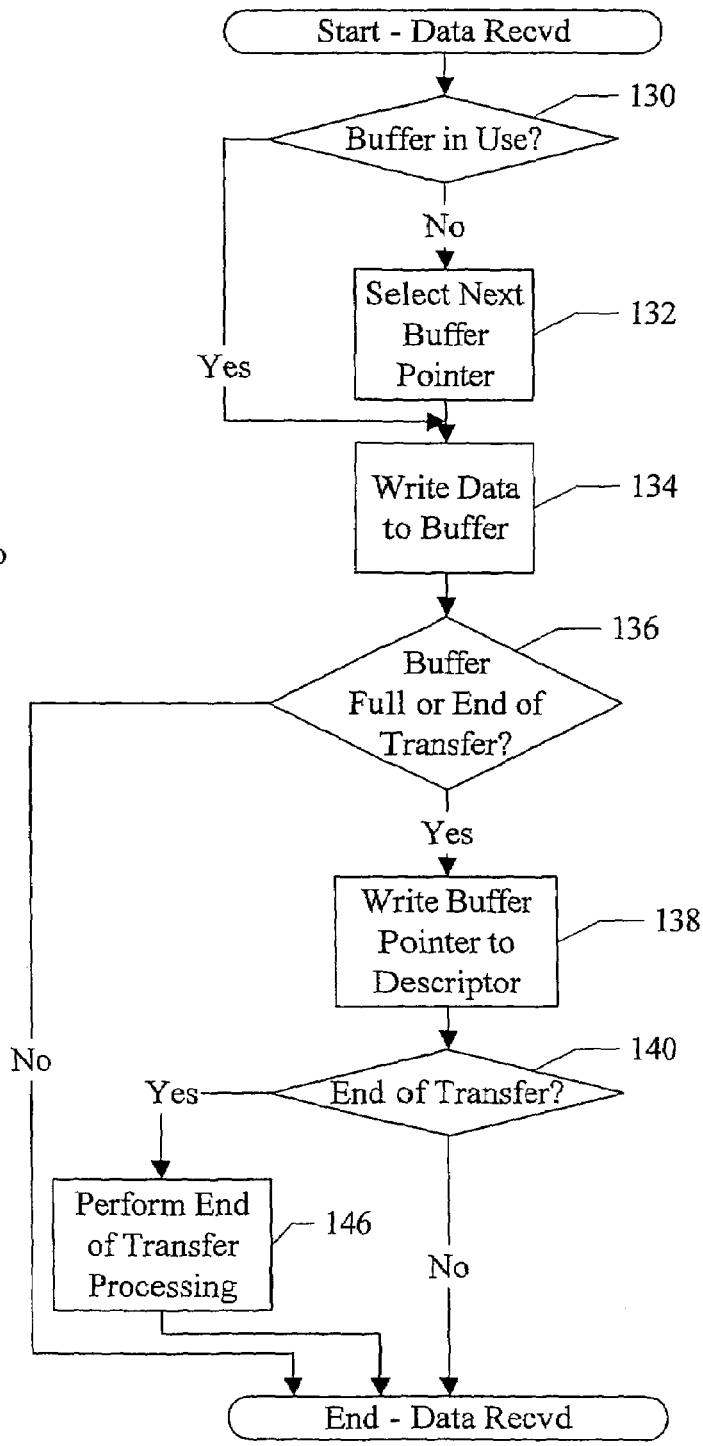
FIG. 7 is a flowchart illustrating operation of one embodiment of a receive control circuit shown in FIG. 2.

Turning now to FIG. 7, a flowchart is shown illustrating operation of one embodiment of the Rx control circuit 58 in response to receiving data. The data may be received from either the loopback circuit 40 or from an interface circuit 16. While blocks are shown in a particular order in FIG. 7 for ease of understanding, the blocks may be implemented in parallel in combinatorial logic circuitry that implements the operation shown in FIG. 7. In some embodiments, one or more of the blocks or the flowchart as a whole may be pipelined over multiple clock cycles.

The Rx control circuit 58 may determine if a buffer is already in use to receive the DMA data (decision block 130). A buffer may be in use if it has previously been selected to store the DMA data and is not yet full. The Rx control circuit 58 may be configured to maintain active buffers for each Rx DMA channel and one or more buffer pointers for the loopback circuit 40. Alternatively, the loopback circuit 40 may provide the buffer pointer with each data transfer, and the Rx control circuit 58 may not maintain the pointers for the loopback circuit 40. If a buffer is not in use (decision block 130, "no" leg), the Rx control circuit 48 may select the next buffer pointer to identify the buffer to be used (block 132). For DMA transfers from the loopback circuit 40, the next buffer pointer is provided by the loopback circuit 40. For DMA transfers from the interface circuits 16, the next buffer pointer may be provided from the Rx prefetch engine 60 and the Rx control circuit 58 may indicate consumption of the pointer to the Rx prefetch engine 60.

In either case, the Rx control circuit 58 may write the received data to the buffer (block 134). That is, the Rx control circuit 58 may generate a write request to the IOM/IOB interface circuit 70 to write the DMA data to memory. The Rx control circuit 58 may monitor the number of bytes written to the buffer to determine when the buffer is full, at least for the data received from the interface circuits 16. In some embodiments, the size of the buffer may be provided by the loopback circuit 40 and the Rx control circuit 58 may monitor for buffer fullness for loopback transfers as well. If the buffer is full, or if the data transfer is indicated by the source (the loopback circuit 40 or the interface circuit 16) as the end of the DMA transfer (decision block 136, "yes" leg), the Rx control circuit 58 may write the buffer pointer to the descriptor for the DMA transfer (block 138). For loopback transfers, there may not be a DMA descriptor for the received data, as the buffer pointers may be destination buffer pointers from the source DMA descriptor, and block 138 may not be performed for such transfers. If the data transfer is indicated as the end of the DMA transfer (decision block 140, "yes" leg), the Rx control circuit 58 may perform various end of transfer processing (block 142). For example, for a DMA transfer from the interface circuits 16, the Rx control circuit 58 may generate various status for the DMA transfer, generate the DMA descriptor header for the transfer, and write the DMA descriptor to the descriptor ring 112A-112N corresponding to the Rx DMA channel on which the data was received. Additionally, the Rx control circuit 58 may signal the end of the transfer to the IOM/IOB circuit 70. Signalling the end of the transfer may inform the IOM/IOB circuit 70 that no more data will be provided on that channel. If an incomplete cache line is updated by the DMA, the IOM/IOB circuit 70 may cause the updated data to be committed to memory (e.g. in the IOC 26, in some embodiments, to avoid a read-modify-write on the interconnect 30).

Figure 8:
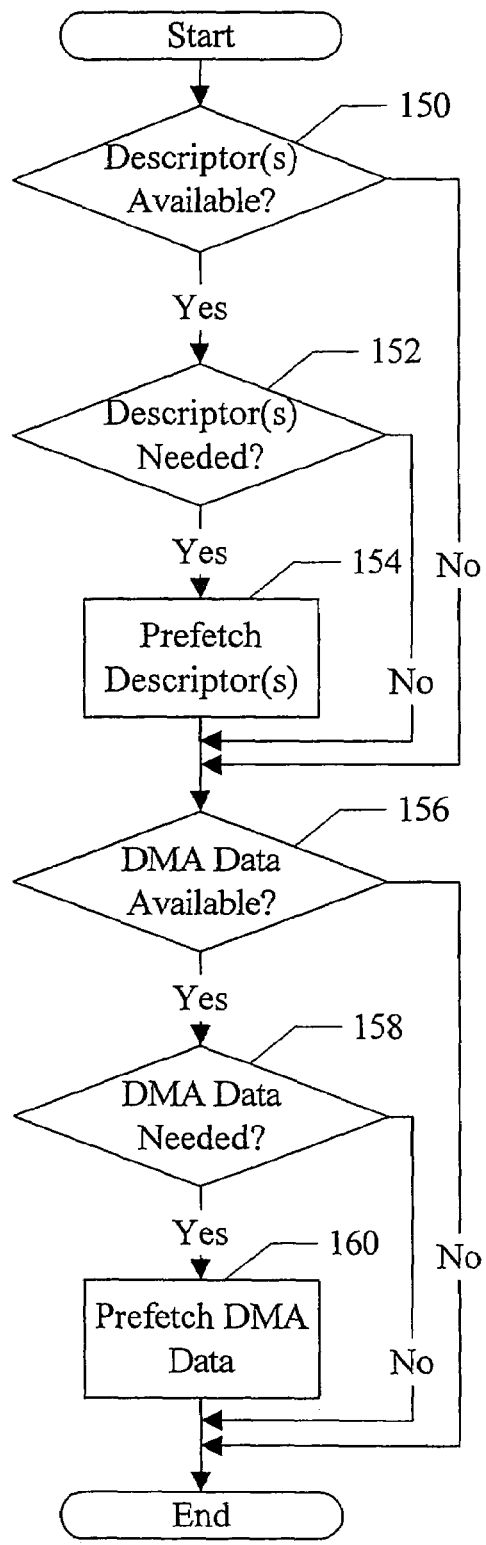
FIG. 8 is a flowchart illustrating prefetch operation of one embodiment of a transmit control circuit shown in FIG. 2.

Turning next to FIG. 8, a flowchart is shown illustrating operation of one embodiment of the Tx control circuit 56 for a given Tx DMA channel. The Tx control circuit 56 may include circuitry that implements the operation shown in FIG. 8 for each Tx DMA channel, operating in parallel and independently. While blocks are shown in a particular order in FIG. 8 for ease of understanding, the blocks may be implemented in parallel in combinatorial logic circuitry that implements the operation shown in FIG. 8. In some embodiments, one or more of the blocks or the flowchart as a whole may be pipelined over multiple clock cycles.

The Tx control circuit 56 may determine if descriptors are available for the channel for prefetch (in the descriptor ring 112A-112N corresponding to the channel) (decision block 150), and if descriptors are needed for the channel (decision block 152). If at least one descriptor is available and needed (decision blocks 150 and 152, "yes" leg), the Tx control circuit 56 may generate a request to read the descriptors from the descriptor ring 112A-112N in the host 12's memory (block 154).

Similar to the buffer pointers being "available" as described above with respect to FIG. 6, descriptors may generally be "available" if there are descriptors in the corresponding descriptor ring 112A-112N that have not been prefetched by the Tx control circuit 56. The descriptors for a Tx DMA channel may be inserted into the descriptor ring 112A-112N by software, and software may indicate that they are available in any of the previously mentioned fashions (e.g. using valid bits in the descriptor ring entries, incrementing a descriptor ring count, etc.). Descriptors may be viewed as "needed" in a variety of fashions as well. For example, if a Tx DMA channel is enabled and there are no descriptors prefetched for the channel, a descriptor may be "needed". In some embodiments, the Tx control circuit 56 may prefetch descriptors as along as there is room in the IOM 24 and/or the buffers 62 to store the descriptors. In other embodiments, the Tx control circuit 56 may be programmable to indicate a number of descriptors that should be prefetched, or a minimum and maximum number of descriptors that should be prefetched. The Tx control circuit 56 may generate prefetch requests for descriptors to attempt to prefetch the programmed number of descriptors.

The Tx control circuit 56 may be informed by the IOM/IOB interface circuit 70 when prefetched descriptors are available in the IOM 24 to be read. The Tx control circuit 56 may, in some embodiments, read some or all of the descriptors from the IOM 24 into the buffers 62.

The Tx control circuit 56 may determine if DMA data is available for the channel for prefetch (to be transmitted on the channel) (decision block 156), and if DMA data is needed for the channel (decision block 158). If DMA data is available and needed (decision blocks 156 and 158, "yes" leg), the Tx control circuit 56 may generate a request to read the DMA data from the host 12's address space (e.g. from memory locations in the host 12) (block 160).

DMA data may be regarded as available for prefetch if the Tx control circuit 56 has a descriptor to be processed (e.g. the descriptor is the next one to be processed from the descriptor ring for the channel), the descriptor data is in the buffers 62 or the IOM 24, and the descriptor data describes a valid DMA transfer to be performed. DMA data may be needed if previous DMA data on the channel has been transmitted (or will be transmitted soon). In some embodiments, the Tx control circuit 56 may be programmable with how much DMA data is to be prefetched at any given time, and DMA data may be needed if less than the desired amount of DMA data has been prefetched and not yet transmitted. In some embodiments, the arbitration scheme among the transmit channels may also affect if DMA data is needed (e.g. if the channel will not win arbitration for a relatively large amount of time, DMA data may not yet be needed since it may not be transmitted until it wins arbitration).

It is noted that the operation illustrated by blocks 156, 158, and 160 may be independent of the operation of blocks 150, 152, and 154 (other than that the prefetched descriptors are used to determine if DMA data is available). Accordingly, circuitry that implements blocks 156, 158, and 160 may be independent of the circuitry that implements blocks 150, 152, and 154 and may evaluate in parallel with such circuitry.

As mentioned above, the operation of FIG. 8 may be performed in parallel for each enabled Tx DMA channel. If more than one prefetch request is generated concurrently, the Tx control circuit 56 may also include circuitry to select among the prefetch requests. For example, the Tx control circuit 56 may select the prefetch request corresponding to Tx DMA channel for which the fewest descriptors or smallest amount of DMA data are currently prefetched and ready. As another example, the Tx control circuit 56 may weight the requests based on which Tx DMA channel has the largest difference between the currently prefetched descriptors/DMA data and the desired number of descriptors/amount of DMA data for that channel. Round-robin or priority based selection mechanisms may also be used, and these schemes may include programmable weighting among the channels, if desired. Starvation prevention mechanisms such as per-channel timeouts may also be used to ensure that descriptors and DMA data are prefetched for each enabled channel.

The Tx control circuit 56 may be informed by the IOM/IOB interface circuit 70 when prefetched DMA data is available in the IOM 24 to be read. The Tx control circuit 56 may, in some embodiments, read some or all of the DMA data from the IOM 24 into the buffers 62. Additionally, the Tx control circuit 56 may transmit the prefetched DMA data to the target, as illustrated for one embodiment in FIG. 9. While blocks are shown in a particular order in FIG. 9 for ease of understanding, the blocks may be implemented in parallel in combinatorial logic circuitry that implements the operation shown in FIG. 9. In some embodiments, one or more of the blocks or the flowchart as a whole may be pipelined over multiple clock cycles.

If the Tx DMA channel is assigned to the loopback circuit 40 (or more particularly, to a loopback component in the loopback circuit 40—decision block 162, "yes" leg), the Tx control circuit 56 may extract the destination buffer pointer or pointers from the DMA descriptor for the transfer and to be transmitted with the DMA data (block 164). The size information for each destination buffer pointer may also be provided so that the Rx control circuit 58 may be informed of the size of the buffers. The loopback circuit 40 may receive the destination buffer pointer(s) and provide them with the data to be written to memory (either the original DMA data, e.g. in a copy DMA transfer, or transformed DMA data, e.g. if encryption is performed). Alternatively, a pointer to the DMA descriptor may be provided if the loopback result is to be written to the DMA descriptor (e.g. a hash result, CRC result, or checksum result). The Tx control circuit 56 may transmit the data to the target interface circuit 16 or loopback component (block 166) along with the channel number, pointers (if any) and control info (if any). Control info may also be extracted from the DMA descriptor (e.g. info selecting the desired loopback operation(s), control info for the interface circuits, etc.).

Figure 9:
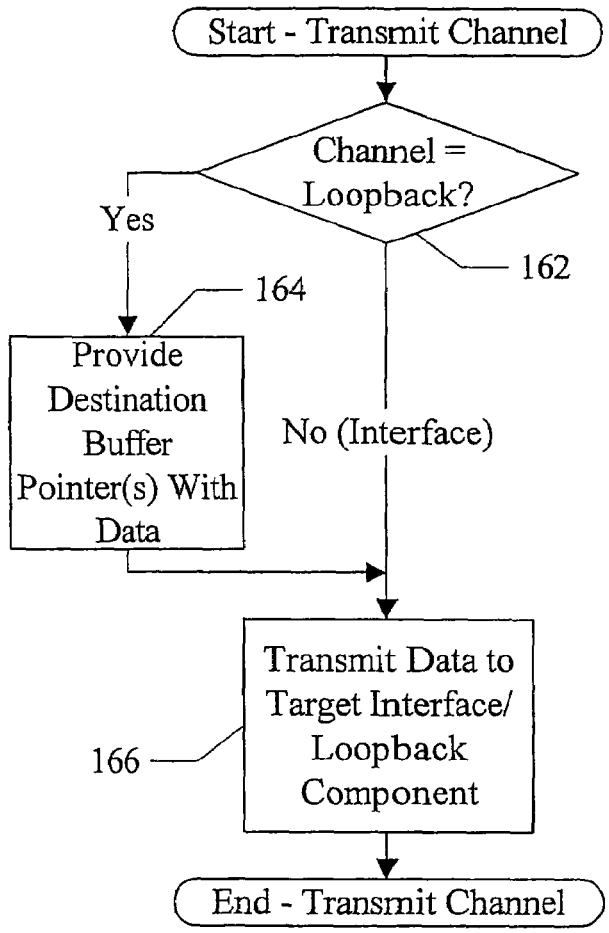
FIG. 9 is a flowchart illustrating transmit operation of one embodiment of a transmit control circuit shown in FIG. 2.

The operation of FIG. 9 may be performed in parallel for each Tx DMA channel. That is, the Tx control circuit 56 may include independent circuitry implementing the operation of FIG. 9 in parallel for each Tx DMA channel. An arbitration mechanism may be used to arbitrate between channels that have DMA data to transmit, to select a channel to transmit on the transmit data path to the interface circuits 16 and loopback circuit 40.

The descriptor rings 112A-112N have been described above as storing various descriptors. In one embodiment, the descriptor rings 112A-112N may store both transfer descriptors (which describe a DMA transfer from a source to a destination) and control descriptors. The control descriptors may not specify a DMA transfer, but instead may encode control information for the channel. For example, the control descriptors may be used to specify configuration (e.g. the contents of one or more configuration registers 38A-38G). Thus, control descriptors may be used to reconfigure the DMA controller 14, components thereof, or other components of the system 10 on the fly, between DMA transfers. Accordingly, software may, for example, establish one or more transfer descriptors to perform DMA transfers under a first configuration, establish one or more control descriptors to change the configuration, establish one or more additional transfer descriptors to perform DMA transfers under a second configuration, and subsequently make the descriptors available on the DMA channel as a unit. The DMA transfers, reconfiguration, and additional DMA transfers may all be performed without processor intervention.

Other types of control descriptors are also contemplated, which control the DMA controller 14 without explicitly causing a DMA transfer. For example, a time trigger descriptor is contemplated that causes a time delay on the DMA channel when the time trigger descriptor is processed. For example, the system 10 may include a timer that may be programmed with a delay value, and processing of the next descriptor in the descriptor ring may be delayed until the timer expires. The timer expiring may generate a trigger event to the DMA controller 14 to "wake up" the DMA controller 14. The user may program the timer with the delay value, or the delay value may be included in the time trigger descriptor, in various embodiments. In other embodiments, the DMA controller 14 may implement the timer. The time trigger descriptor may have a variety of uses. For example, time trigger descriptors may be interleaved with copy DMA descriptors that copy from a source address space to a destination address space. The source address space may comprise one or more memory mapped I/O registers or other system status registers. Thus, the repeated copy DMA transfers may be used to read the registers and write the results to destinations, delayed by the time trigger descriptor. The copy DMA transfers may take the place of a software polling loop on the processors 18A-18B, freeing the processors for other operations.

Figure 10:
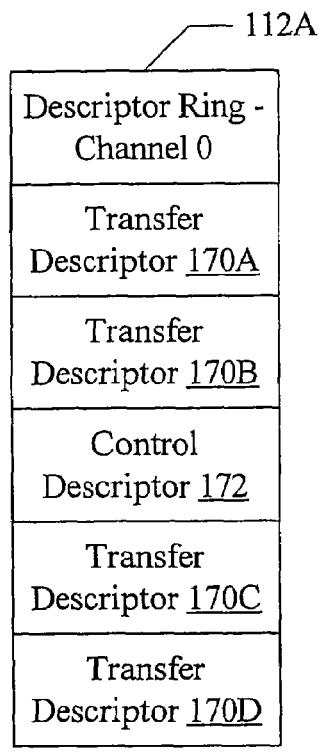
FIG. 10 is a block diagram illustrating a descriptor ring with a control descriptor included with the transfer descriptors.

FIG. 10 is a block diagram of one embodiment of the descriptor ring 112A corresponding to channel 0, illustrating an example of embedding a control descriptor within the transfer descriptors in a descriptor ring. More than one control descriptor may be embedded in the fashion of FIG. 10 (either consecutively or at different points in the ring), as desired.

In FIG. 10, 2 transfer descriptors 170A-170B are shown, followed by a control descriptor 172, followed by 2 more transfer descriptors 170C-170D. Thus, for this example, the two DMA transfers specified by the descriptors 170A-170B would be performed by the Tx control circuit 56, followed by the processing of the control descriptor 172. Subsequent to processing the control descriptor 172, the two DMA transfers specified by the descriptors 170C-170D would be performed.

Figure 11:
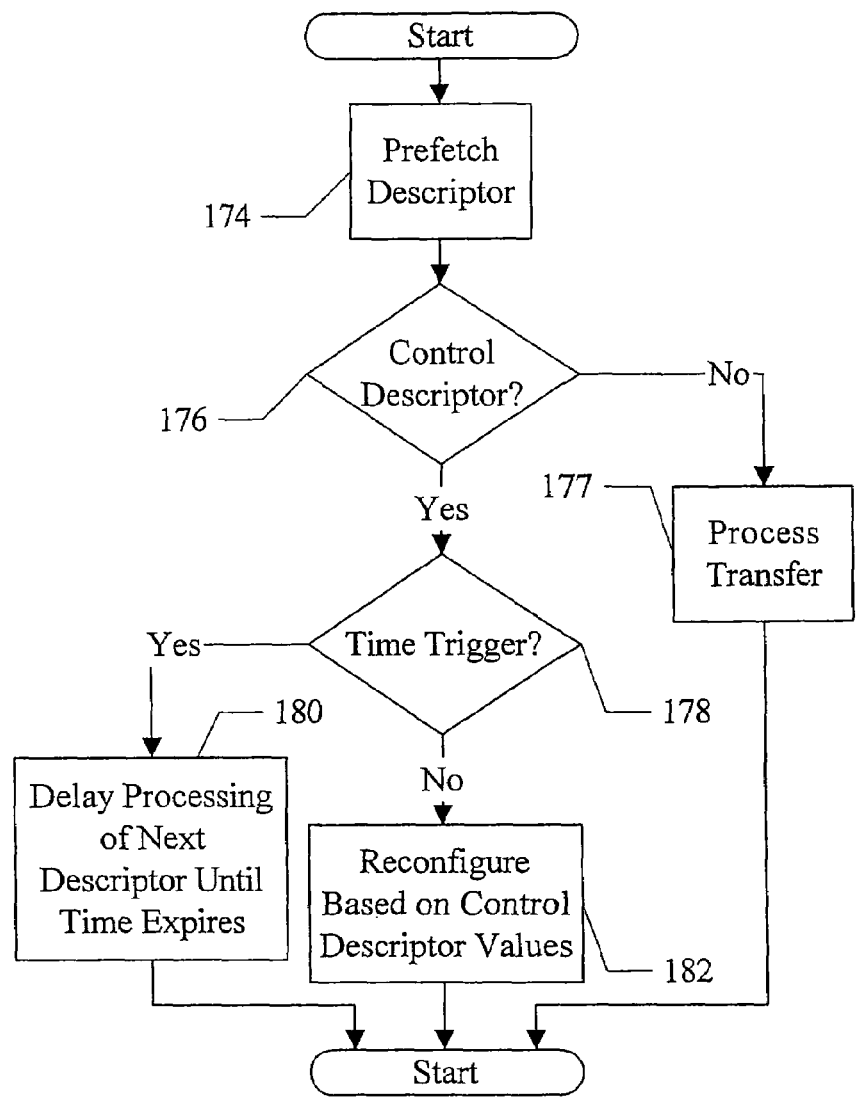
FIG. 11 is a flowchart illustrating one embodiment of processing of control descriptors.

FIG. 11 is a flowchart illustrating additional processing that one embodiment of the Tx control circuit 56 may employ for control descriptors embedded with transfer descriptors in a descriptor ring corresponding to a Tx DMA channel. The Tx control circuit 56 may include circuitry that implements the operation shown in FIG. 11 for each Tx DMA channel, operating in parallel and independently. While blocks are shown in a particular order in FIG. 11 for ease of understanding, the blocks may be implemented in parallel in combinatorial logic circuitry that implements the operation shown in FIG. 11. In some embodiments, one or more of the blocks or the flowchart as a whole may be pipelined over multiple clock cycles.

The Tx control circuit 56 may prefetch a descriptor from the descriptor ring (block 174), assuming one is available and needed for the channel (e.g. as described with respect to FIG. 8). The Tx control circuit 56 may process the descriptor when it is returned to the Tx control circuit 56, and may determine if the descriptor is a control descriptor (decision block 176).

For example, the descriptor header may include a type field specifying whether the descriptor is a transfer descriptor or a control descriptor. If the descriptor is a transfer descriptor (decision block 176, "no" leg), the Tx control circuit 56 may process the transfer descriptor (block 177). For example, processing the transfer descriptor may be similar to the description above with regard to FIGS. 8 and 9.

If the descriptor is a control descriptor (decision block 176, "yes" leg), the Tx control circuit may determine if the control descriptor is a time trigger descriptor (decision block 178). A time trigger descriptor may be indicated via an encoding in the header of the control descriptor. Alternatively, a time trigger descriptor may specify a value to be loaded into a configuration register 38A-38G, similar to other configuration descriptors. The value loaded may specify the desired delay. The Tx control circuit 56 may detect the time trigger by decoding the register address of the configuration register being loaded. If the control descriptor is a time trigger descriptor (decision block 178, "yes" leg), the Tx control circuit 56 may delay processing of the next descriptor from the descriptor ring until the delay specified by the time trigger descriptor expires (block 180). If the control descriptor is not a time trigger descriptor (decision block 178, "no" leg), the Tx control circuit 56 may reconfigure using the control descriptor values (block 182). For example, the control descriptor may comprise a register address identifying a configuration register 38A-38G and a value to write to the configuration register. The Tx control circuit 56 may cause the write to occur. Alternatively, the control descriptor may include a buffer pointer to a memory buffer storing a list of register addresses and values to be written to those registers. Thus, a relatively large amount of configuration may be performed using a control descriptor. Instructions to write each configuration register, executed on the processors 18A-18B, may be eliminated by using a control descriptor, in some embodiments.

FIGS. 12-16 illustrate examples of descriptors of various types according to one embodiment of the DMA controller 14. Generally, the descriptors comprise a header, optionally a data field to store a result (e.g. a result generated by the loopback circuit 46), and one or more buffer pointers that point to buffers storing DMA data (source buffer pointers) or to buffers that may be used to store DMA data (destination buffer pointers).

In the present embodiment, descriptors vary based on whether they are receive or transmit DMAs, or the function to be performed by the loopback circuit 40, if selected. Receive descriptors are used for Rx DMA transfers, and other types of descriptors are used by the Tx DMA transfers and loopback functions. The DMA controller 14 (and more particularly the Tx control circuit 56, in one embodiment) may determine the format of the descriptors in a descriptor ring for a given Tx DMA channel based on the assignment of that channel to the interface circuits 16 or to a function in the loopback circuit 40.

In FIGS. 12-16, various fields are illustrated in detail (e.g. the header field in particular). While certain information is shown in FIGS. 12-16, it is not intended to preclude the use of other information in addition to that illustrated, or in addition to a subset of that illustrated, or as an alternative to that illustrated. Various additional information may be included, in various implementations, as desired.

FIG. 12 is a block diagram of one embodiment of a receive descriptor 190. The receive descriptor 190 may be the format of descriptors generated by the Rx control circuit 58 and written to the descriptor rings 112A-112N that correspond to Rx DMA channels. In the embodiment of FIG. 12, the receive descriptor 190 includes a header field 192 (illustrated in exploded view in FIG. 12 for one embodiment), an optional hash result field 194, and one or more buffer pointer fields 196A-196N. Each buffer pointer field 196A-196N includes a size field that may be encoded with the size of the buffer and a pointer field encoded with the pointer to the buffer. The Rx control circuit 58 may be configured to write the buffer pointer fields 196A-196N with buffer pointers used from the buffer pointer rings 114A-114M to store the received DMA data. The hash result field 194 may be used to store a hash result.

The exploded view of the receive header field 192 includes a type field 192A, a style field 192B, a hash reserve field 192C, a buffer count field 192D, a packet length field 192E, and a status field 192F. The type field 192A may encode the descriptor type, e.g. control descriptor or transfer descriptor. The type field 192A (and other similar type fields described below for other descriptors) may identify the descriptor as a transfer descriptor except for the control descriptor shown in FIG. 16. The style field 192B may encode the style of the descriptor, which refers to whether the buffer pointers in the buffer pointer fields 196A-196N include both source and destination pointers or only destination pointers (since the source is an interface circuit for Rx DMA transfers). The hash reserve field 192C may be used to indicate whether or not the optional hash result field 194 is included in the descriptor. The buffer count field 192D may be encoded with a count of the number of buffers used to store the received DMA data, and thus the number of buffer pointer fields 196A-196N. The packet length field 192E may be encoded with the length of the packet stored in the buffers (e.g. in bytes). The status field 122F may comprise various status of the transfer, which may include status generated by the Rx control circuit 58 (e.g. error indications) and/or status provided by the source interface circuit 16. The Rx control circuit 58 may write the receive header 192 when terminating a DMA transfer.

Figure 13:
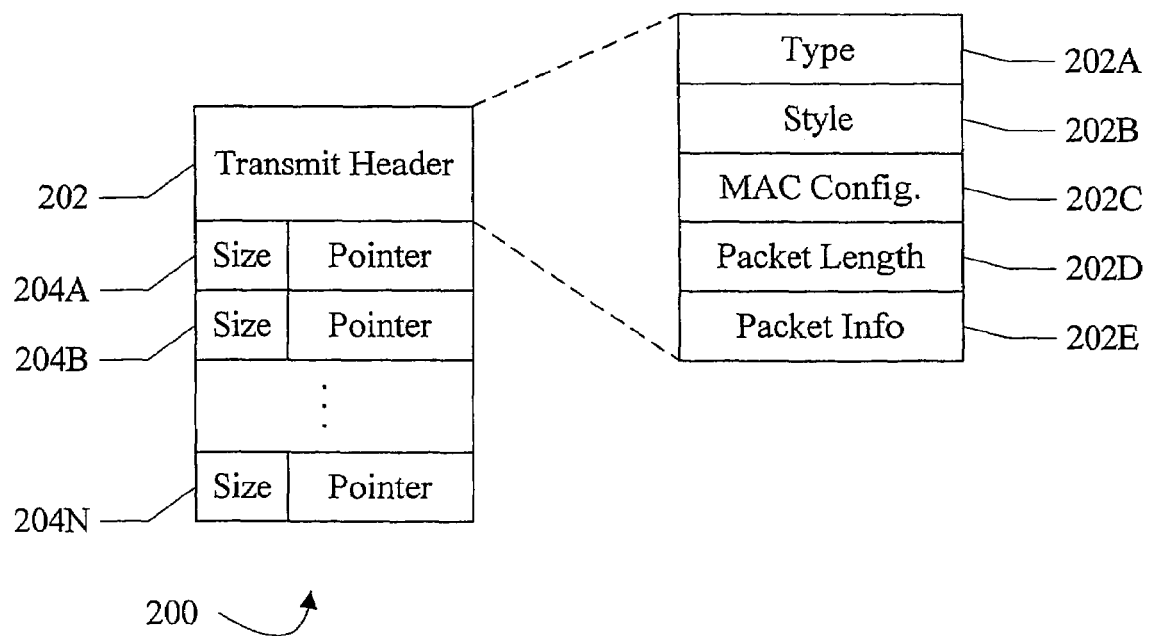
FIG. 13 is a block diagram illustrating one embodiment of a transmit DMA descriptor.

FIG. 13 is a block diagram of one embodiment of a transmit descriptor 200. The transmit descriptor 200 may be the format of descriptors used by the Tx control circuit 56 for Tx DMA transfers to interface circuits 16, particularly to MACs 34A-34B, and may be written by software to the descriptor rings 112A-12N that correspond to Tx DMA channels assigned to the interface circuits 16. In the embodiment of FIG. 13, the transmit descriptor 200 includes a header field 202 (illustrated in exploded view in FIG. 13 for one embodiment) and one or more buffer pointer fields 204A-204N. Each buffer pointer field 204A-204N includes a size field that may be encoded with the size of the buffer and a pointer field encoded with the pointer to the buffer. The Tx control circuit 56 may be configured to read the buffer pointer fields 204A-204N to prefetch the DMA data from the buffers for transmission.

The exploded view of the transmit header field 202 includes a type field 202A, a style field 202B, a MAC configuration field 202C, a packet length field 202D, and a packet info field 202E. The type field 202A and style field 202B may be similar to the type field 192A and style field 192B described above. The MAC configuration field 202C may be encoded with various packet-specific MAC configuration information for the MAC 34A-34B that is targeted by the DMA transfer. For example, the MAC configuration field 202C may include virtual local area network (VLAN) configuration (e.g. none, insert, remove, or modify), CRC configuration (e.g. none, insert CRC, pad CRC, modify CRC), and whether to modify the MAC source address. The packet length field 202D may be encoded with the length of the packet stored in the buffers (e.g. in bytes). The packet info field 202E may be encoded with various information describing the packet (e.g. IP header length, Ethernet header length, type of packet (TCP/UDP), checksum enable, etc.).

Figure 14:
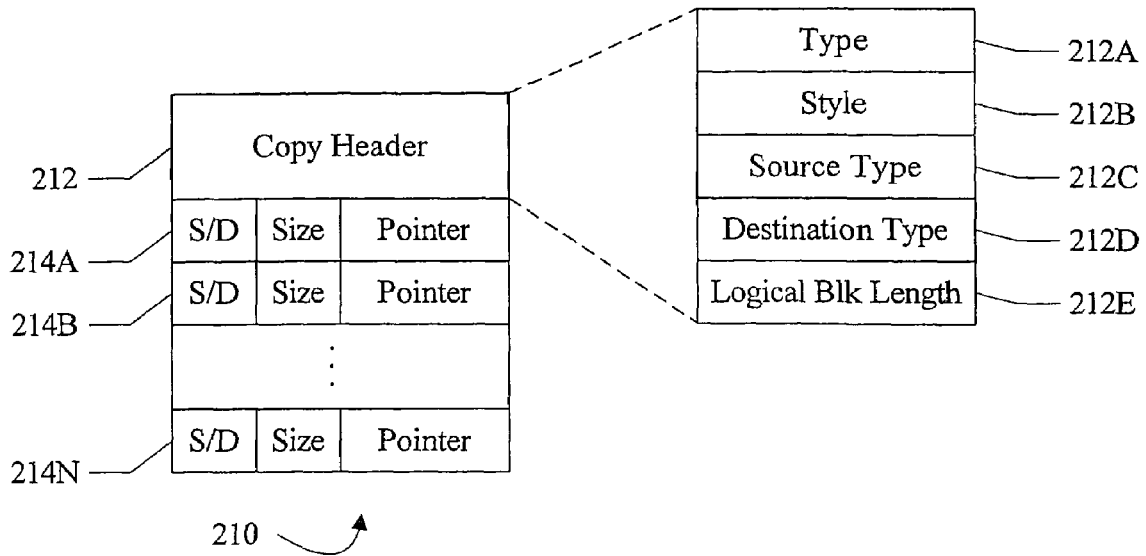
FIG. 14 is a block diagram illustrating one embodiment of a copy DMA descriptor.

FIG. 14 is a block diagram of one embodiment of a copy descriptor 210. The copy descriptor 210 may be the format of descriptors used by the Tx control circuit 56 for copy DMA transfers (from one memory region in the host 12 to another memory region in the host 12) using the copy FIFO 42. Thus, the copy descriptor 210 may be used in the descriptor rings 112A-112N that correspond to Tx DMA channels assigned to the copy FIFO 42. In the embodiment of FIG. 14, the copy descriptor 210 includes a header field 212 (illustrated in exploded view in FIG. 14 for one embodiment) and one or more buffer pointer fields 214A-214N. Each buffer pointer field 214A-214N includes a size field that may be encoded with the size of the buffer and a pointer field encoded with the pointer to the buffer. Additionally, in this embodiment, each buffer pointer field 214A-214N includes a source/destination (S/D) field identifying the pointer as either a source pointer (locating a buffer storing source DMA data) or a destination pointer (locating a buffer to which the DMA data is to be stored). The Tx control circuit 56 may be configured to read the buffer pointer fields 214A-214N to prefetch the DMA data from the source buffers for transmission and to provide the destination pointers to the copy FIFO 42 for transmission to the Rx control circuit 58.

In one embodiment, there may be more than one source pointer for a given destination pointer in the copy descriptor 210. The DMA controller 14 may copy data from the source buffers in the order listed in the copy descriptor 210 into the destination buffer. Thus, the DMA controller 14 may support gathering of scattered data from multiple memory regions into a destination memory region in the copy operation. Similarly, in one embodiment, there may be more than one destination pointer for a given source pointer in the copy descriptor 210. In such embodiments, scatter of the data from the source buffer may be supported.

The exploded view of the transmit header field 212 includes a type field 212A, a style field 212B, a source type field 212C, a destination type field 212D, and a logical block length field 212E. The type field 212A and style field 212B may be similar to the type field 192A and style field 192B described above. The source type field 212C and the destination type field 212D may be encoded to indicate how the source buffer pointer(s) and destination buffer pointer(s) should be modified as the DMA transfer progresses. For example, each buffer pointer may be one of the following types, in one embodiment: sequential increment; sequential decrement; or fixed (with various fixed widths, e.g. 1, 2, 4, 8, or 16 bytes). Sequential increment indicates that the address is incremented after each data transmission by the amount of data transmitted. Sequential decrement is similar, but the address is decremented. Sequential increment or sequential decrement may be used for memory regions, where the data is written to sequential memory locations. The fixed option may be used if an address is memory mapped to a register or port of a device, and the width may be the width of each transmission to the register/device. The source type field 212C may also have an encoding for zero, and may be used to write a block of zeros to the destination. The destination type field 212D may also have an encoding for prefetch only, in which the source DMA data is prefetched but not written to a destination. The logical block length field may be used, in some embodiments, to indicate the length of a logical DMA block that may span multiple DMA descriptors. That is, the logical DMA operation may actually be specified using multiple descriptors, and the logical DMA block length may be the length of the logical DMA operation (e.g. the sum total of data transfer over the multiple descriptors).

The XOR circuit 46 may use descriptors that are similar to the transmit DMA descriptor 200. Multiple channels may be assigned to the XOR circuit 46, and descriptors in each of the channels may specify one of the XOR sources. The first channel may also specify the destination for the XOR result (a destination buffer or buffers).

Figure 15:
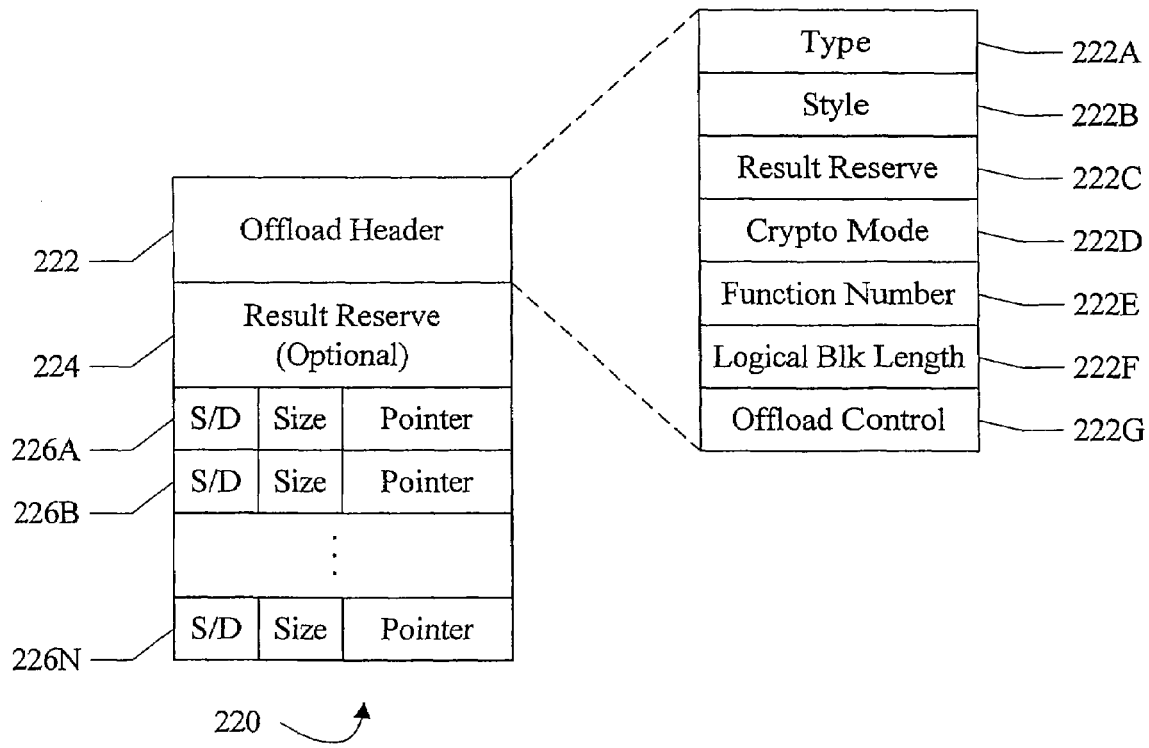
FIG. 15 is a block diagram of one embodiment of an offload DMA descriptor.

FIG. 15 is a block diagram of one embodiment of an offload descriptor 220. The offload descriptor 220 may be the format of descriptors used by the Tx control circuit 56 for DMA transfers that specify the offload engine 44. Thus, the offload descriptor 220 may be used in the descriptor rings 1112A-112N that correspond to Tx DMA channels assigned to the offload engine 44. In the embodiment of FIG. 15, the offload descriptor 220 includes a header field 222 (illustrated in exploded view in FIG. 15 for one embodiment), an optional result reserve field 224, and one or more buffer pointer fields 226A-226N. Each buffer pointer field 226A-226N includes a size field that may be encoded with the size of the buffer and a pointer field encoded with the pointer to the buffer. Additionally, in this embodiment, each buffer pointer field 226A-226N includes a source/destination (S/D) field identifying the pointer as either a source pointer (locating a buffer storing source DMA data) or a destination pointer (locating a buffer to which the DMA data is to be stored). The Tx control circuit 56 may be configured to read the buffer pointer fields 226A-226N to prefetch the DMA data from the source buffers and to identify destination buffers, if any. If transformed DMA data is the result of the offload engine 44, there may be destination pointers for the transformed DMA data. If a result separate from the DMA data is generated (e.g. for storage in the result reserve field 224), there may be no destination pointers in some cases and the DMA data may not be written to a destination.

The exploded view of the offload header field 222 includes a type field 222A, a style field 222B, a result reserve field 222C, a crypto mode field 222D, a function number field 222E, a logical block length field 222F, and an offload control field 222G. The type field 222A and style field 222B may be similar to the type field 192A and style field 192B described above, and the logical block length field 222F may be similar to the logical block length field 212E described above. The result reserve field 222C may be encoded to indicate whether or not the result reserve field 224 is included in the offload header descriptor 220, and may also indicate the size of the result reserve field 224 (e.g. 64 bit, 192 bit, or 320 bit, in one embodiment). The result reserve field 224 may be used to store the result generated by the offload engine 44, if the result is not transformed DMA data or is generated in addition to transformed DMA data. The crypto mode field 222D may be encoded with the desired mode for the offload engine 44 to process the data, if any. The crypto mode may include none, signature only (e.g. CRC or checksum in the generators 86 or 88), encryption only, decryption only, encryption and hash (with options for hash first or encryption first), or decryption and hash (with options for hash first or decryption first). The function number field 222E may be encoded with the function number for those modes that use the security circuits 84A-84D (e.g. one of eight logical functions formed from the security circuits 84A-84D, as mentioned above). The offload control field 222G may include additional control information for the DMA transfer. For example, the length of each of the signature header, the cipher header, cipher trailer, and the hash size may be included in the offload control field 222G. Similarly, the selected encryption/decryption (cipher) algorithm, hash algorithm, and block cipher mode may be encoded in the offload control field 222G. Various other control bits may be included in the offload control field 222G as well.

Figure 16:
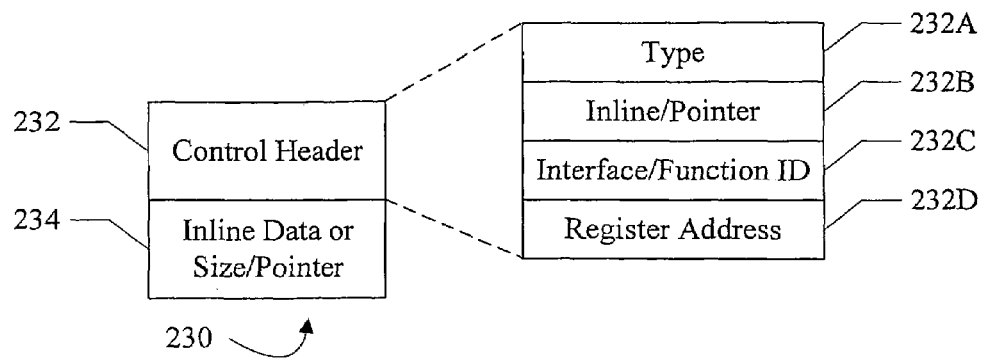
FIG. 16 is a block diagram of one embodiment of a control descriptor.

FIG. 16 is a block diagram of one embodiment of a control descriptor 230. The control descriptor 230 may be the format of control descriptors used by the Tx control circuit 56 in any DMA channel. In the embodiment of FIG. 16, the control descriptor 230 includes a header field 232 (illustrated in exploded view in FIG. 16 for one embodiment) and a data or size/pointer field 234. The data or size/pointer field 234 may either store inline data to be written to a configuration register 38A-38G or a buffer pointer (and buffer size) pointing to a buffer that stores a list of register addresses and configuration data to be written to the registers.

The exploded view of the control header field 232 includes a type field 232A, an inline/pointer field 232B, an interface/function ID field 232C, and a register address field 232D. The type field 232A may be similar to the type field 192A described above, identifying the descriptor 230 as a control descriptor. The inline/pointer field 232B may be encoded to indicate whether the data or size/pointer field 234 stores inline data to be written to a configuration register, a pointer to a buffer of register addresses and configuration data, or an event. The interface/function ID field 232C is encoded to identify the target of the configuration data (e.g. an interface circuit, a function in the offload engine 44, etc.). Register addresses may be local to the interface/function ID in this embodiment. The register address field 232D may be encoded with a register address if the control descriptor 230 has inline data.

Figure 17:
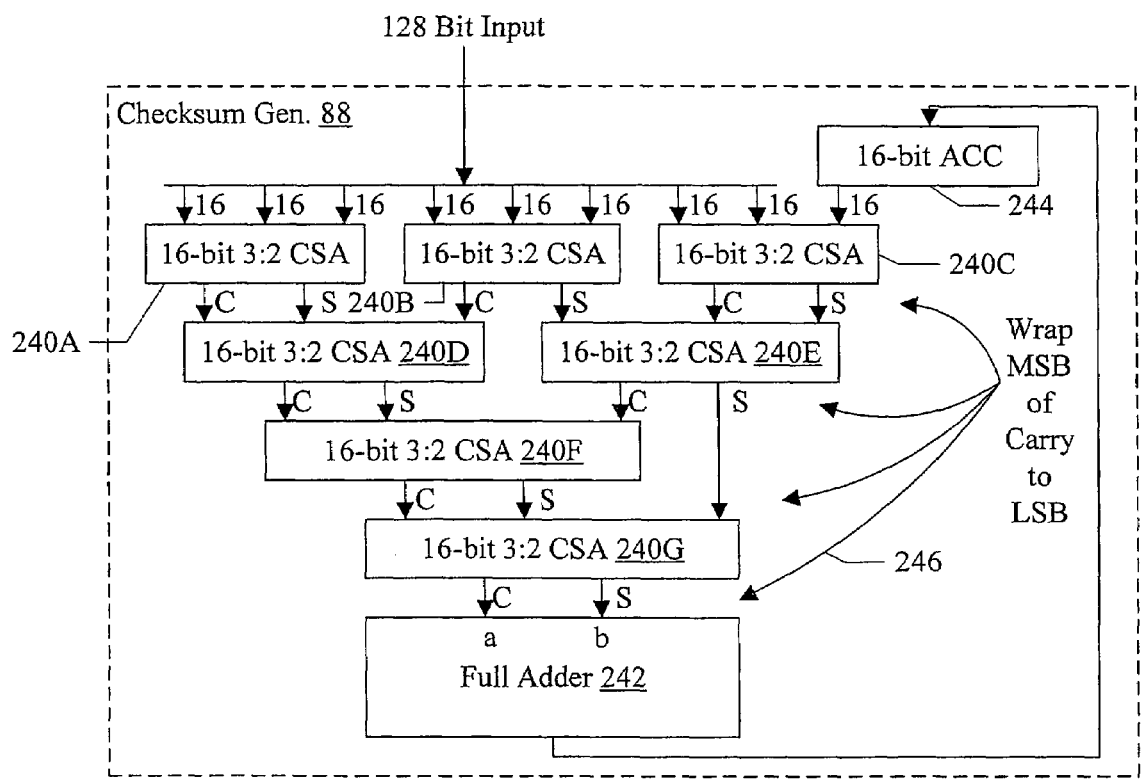
FIG. 17 is a block diagram of one embodiment of a checksum generator shown in FIG. 3.

Turning now to FIG. 17, a block diagram of one embodiment of the checksum generator 88 is shown. In the embodiment of FIG. 17, the checksum generator 88 includes a plurality of 16-bit 3:2 carry-save adders (CSAs) 240A-240G, a full adder 242, and a 16-bit accumulator (ACC) 244. The checksum generator 88 is coupled to receive a 128 bit (16 byte) input (e.g. from the Tx control circuit 56). The 128 bit input is divided into 16 bit portions that are supplied as inputs to the CSAs 240A-240C. Additionally, the output of the accumulator 244 is coupled as an input to the CSA 240C. Each CSA 240A-240C outputs a sum and a carry term, marked "S" and "C" in FIG. 17. The sum and carry outputs of the CSAs 240A-240C are input to the CSAs 240D and 240E. The sum and carry outputs of the CSA 240D and the carry output of the CSA 240E are input to the CSA 240F. The sum output of the CSA 240E and the sum and carry outputs of the CSA 240F are input to the CSA 240G. The sum and carry outputs of the CSA 240G are input to the full adder 242, which produces the sum to be stored in the accumulator 244.

CSAs receive N-bit inputs and produce sum and carry output terms that do not ripple the carry from position to position. That is, the sum output bits are the sum of the input bits at that bit position, independent of the bits at the other bit positions. Each sum bit may be the XOR of the input bits at that bit position. The carry output bits are the carry from the sum of a given bit position, independent of the carry at other bit positions. Arithmetically, the carry term is viewed as the carry-in to the next most significant bit position. Accordingly, the carry bit at the least significant bit position is zero, and there are logically N+1 carry bits from an N-bit CSA.

As illustrated by the arrows 246, at each point where a carry term output from a CSA is provided as in input to another CSA or the full adder 242, the most significant carry bit is "wrapped around" to the least significant bit of the carry term. That is, the most significant bit of the carry term is deleted from the most significant bit position and is inserted at the least significant bit position, in place of the least significant bit, which is always zero. In this fashion, the inputs to each CSA and the full adder 242 are always 16 bits, and all of the carry bits are represented on the inputs. For the 16-bit CSAs shown in FIG. 17, the carry term output may logically be a 17-bit value with the least significant bit 0. The carry term output is input to the next CSA (or the full adder 242) as follows:

In[15:0]=Carry[15:1]||Carry[16] (and Carry[0]=0 is dropped)

The wrapping around of the most significant carry bit to the least significant carry bit may be accomplished through wire routing between the carry term output of one CSA and the input to the next CSA.

In some embodiments, the checksum generator 88 as illustrated in FIG. 17 may generate a 16 bit checksum in one pass, storing the checksum in the accumulator 244. The accumulator 244 may also be 16-bits in this embodiment, since the carries have been wrapped around and added in by the CSAs 240A-240G and the full adder 242 as each 128 bit input is accumulated in the checksum.

For checksum generation, a one's complement sum is being generated. Wrapping the carry bits output by the CSAs from the most significant to the least significant bit can be shown to generate a correct one's complement sum.

The CSAs 240A-240G may be viewed as a set of levels of CSAs. The first level of CSAs (CSAs 240A-240C) have inputs coupled to the inputs to the checksum generator and an input coupled to the output of the accumulator. At other levels, the inputs are coupled to the outputs of the CSAs at a preceding level (or levels, e.g. in the case of the CSA 240G). At each level, the carry outputs from preceding levels have their most significant bits wrapped around to the least significant bit to be input to that level.

The present embodiment may use 16-bit CSAs to produce a 16-bit checksum that is used in TCP, IP, and ICMP. Other embodiments may use larger or smaller checksums, and larger or smaller CSAs may be used in such embodiments. Thus, in general, an N-bit 3:2 CSA may be used. Similarly, while a 128 bit input is used in the illustrated embodiment, other embodiments may use any number of bits of input. The number of levels of CSAs may be changed accordingly.

While the embodiment of FIG. 17 is shown as being implemented in the checksum generator 88, similar circuitry may be used in the IOB 22 for partial checksum generation (as described previously) and in the interface circuits 16 to complete the partial checksum.

Figure 18:
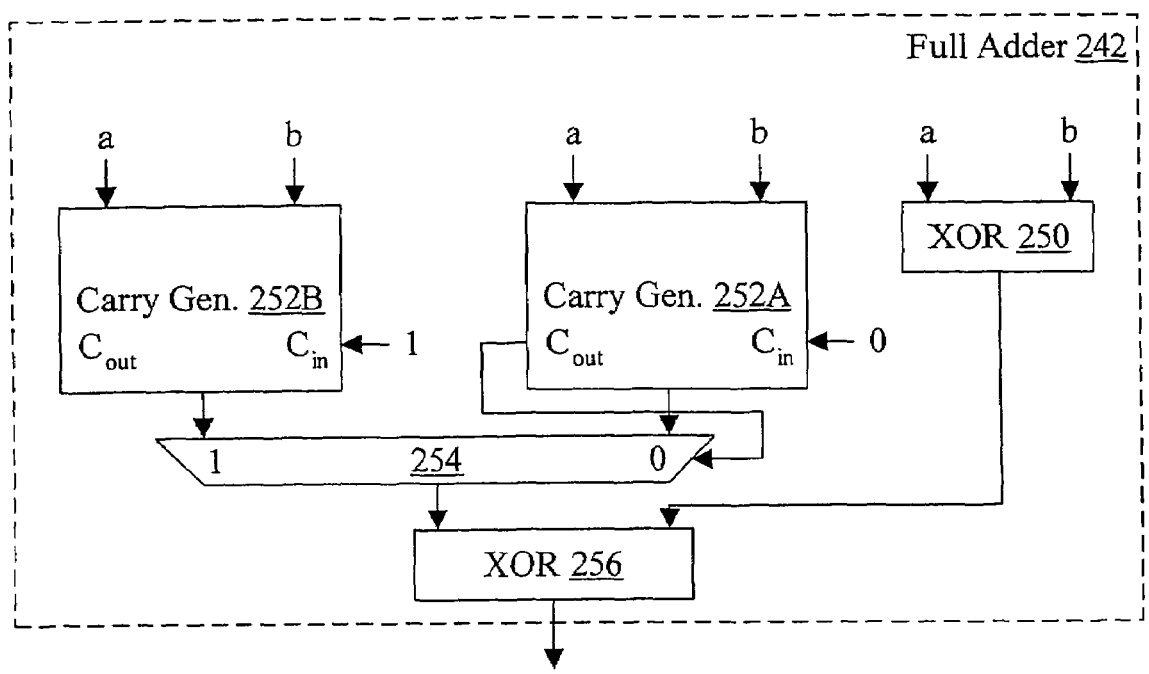
FIG. 18 is a block diagram of one embodiment of a full adder shown in FIG. 17.

Turning now to FIG. 18, a block diagram of one embodiment of the full adder 242 is shown. In the illustrated embodiment, the full adder 242 may include an XOR circuit 250 and a pair of carry generation circuits 252A-252B. The XOR circuit 250 and the carry generation circuits 252A-252B are coupled to receive the "a" and "b" inputs to the full adder (which are the sum and carry outputs of the CSA 240G in FIG. 17, with the carry output most significant bit removed and inserted at the least significant bit). The carry generator 252A is coupled to receive a carry-in ($C_{in}$) input of zero, and the carry generator 252B is coupled to receive a carry-in input of one. The carry-out ($C_{out}$) output of the carry generator 252A is provided as the selection control of a multiplexor (mux) 254, which has the carry outputs of the carry generators 252A-252B as inputs. The output of the mux 254 is coupled as an input to a second XOR circuit 256, which also has the output of the XOR circuit 250 as an input. The output of the XOR circuit 256 is the output of the full adder 242.

The XOR circuit 250 bitwise XORs the a and b inputs, effectively performing another sum term generation similar to the CSA adders 240. The carry generators 252A-252B perform true carry generation on the a and b inputs, and if the carry out of the carry generator 252A is a zero, the output of the carry generator 252A is selected through the mux 254 for XOR with the sum term from the XOR circuit 250, thereby creating the final one's complement sum. On the other hand, if the carry out of the carry generator 252A is a one, the output of the carry generator 252B is selected through the mux 254. Since the carry in to the carry generator 252B is a one, the carry generator 252B has effectively wrapped around the carry out from the most significant bit again. Viewed in another way, the carry generators 252A-252B and mux 254 may selectively wrap around one more carry bit based on whether or not the carry is generated.

Numerous variations and modifications will become apparent to those skilled in the art once the above disclosure is fully appreciated. It is intended that the following claims be interpreted to embrace all such variations and modifications.

What is claimed is:

1. A checksum generator comprising:
   an N-bit accumulator; and
   a plurality of N-bit 3:2 carry save adders;
   wherein a first plurality of the plurality of N-bit 3:2 carry save adders are coupled to receive N-bit inputs extracted from an input to the checksum generator, and wherein one of the first plurality has an N-bit input coupled to the output of the accumulator; and
   wherein a second plurality of the plurality of N-bit 3:2 carry save adders have inputs coupled to outputs of the first plurality, and wherein a most significant bit of each carry output of the first plurality is inserted as a least significant bit of the input to the second plurality and remaining bits of the carry output are connected in more significant bit positions than the least significant bit of the input.

2. The checksum generator as recited in claim 1 wherein the plurality of N-bit 3:2 carry save adders further comprises a third N-bit 3:2 carry save adder having inputs coupled to the outputs of the second plurality, wherein the most significant bit of each carry output of the second plurality is inserted as the least significant bit of the input to the third N-bit 3:2 carry save adder.

3. The checksum generator as recited in claim 2 wherein the plurality of N-bit 3:2 carry save adders further comprises a fourth N-bit 3:2 carry save adder coupled to the outputs of the third N-bit 3:2 carry save adder and an output of one of the second plurality, wherein the most significant bit of the carry output of the third N-bit 3:2 carry save adder is inserted as the least significant bit of the input to the fourth N-bit 3:2 carry save adder.

4. The checksum generator as recited in claim 3 further comprising a full adder having inputs coupled to the outputs of the fourth N-bit 3:2 carry save adder and an output coupled to the input of the accumulator, wherein the most significant bit of the carry output of the fourth N-bit 3:2 carry save adder is inserted as the least significant bit of the input to the full adder.

5. The checksum generator as recited in claim 4 wherein the full adder comprises:
   a first carry generator coupled to receive the inputs of the full adder, the first carry generator having a carry-in input coupled to binary zero and a carry-out output;
   a second carry generator coupled to receive the inputs of the full adder, the second carry generator having a carry-in input coupled to binary one;
   a multiplexor coupled to the outputs of the first and second carry generators, wherein a selection control of the multiplexor is coupled to the carry-out output of the first carry generator;
   a first exclusive OR (XOR) circuit coupled to the inputs of the full adder; and
   a second XOR circuit having inputs coupled to the output of the multiplexor and the output of the first XOR circuit, wherein an output of the second XOR circuit is the output of the full adder.

6. The checksum generator as recited in claim 4 wherein the full adder comprises:
   a first carry generator coupled to receive the inputs of the full adder, the first carry generator having a carry-in input coupled to binary zero and a carry-out output;
   a second carry generator coupled to receive the inputs of the full adder, the second carry generator having a carry-in input coupled to binary one;
   a multiplexor coupled to the outputs of the first and second carry generators, wherein a selection control of the multiplexor is coupled to the carry-out output of the first carry generator;
   a first exclusive OR (XOR) circuit coupled to the inputs of the full adder; and
   a second XOR circuit having inputs coupled to the output of the multiplexor and the output of the first XOR circuit, wherein an output of the second XOR circuit is the output of the full adder.

7. A checksum generator comprising:
   an N-bit accumulator; and
   a plurality of N-bit 3:2 carry save adders arranged as a plurality of levels, wherein each of the plurality of levels includes at least one of the plurality of N-bit 3:2 carry save adders, and wherein a first level of the plurality of levels has inputs coupled to N-bit inputs extracted from an input to the checksum generator and the N-bit output of the accumulator, and wherein inputs at other levels of the plurality of levels are coupled to the outputs of the preceding one or more levels, and wherein a most significant bit of each carry output of a given level of the plurality of levels is inserted as a least significant bit of the input to the next level of the plurality of levels and remaining bits of the carry output are connected in more significant bit positions than the least significant bit of the input.

8. The checksum generator as recited in claim 7 wherein a last level of the plurality of levels comprises a first N-bit 3:2 carry save adder of the plurality of N-bit 3:2 carry save adders, wherein the first N-bit 3:2 carry save adder has inputs coupled to the outputs of a next to last level of the plurality of levels and also has one input coupled to an output from another level that is next to the next to last level.

9. The checksum generator as recited in claim 8 further comprising a full adder having inputs coupled to the outputs of the first N-bit 3:2 carry save adder and an output coupled to the input of the accumulator, wherein the most significant bit of the carry output of the first N-bit 3:2 carry save adder is inserted as the least significant bit of the input to the full adder.

10. An apparatus comprising:
    a memory controller configured to couple to a memory; and
    a direct memory access (DMA) controller coupled to the memory controller, wherein the DMA controller comprises a checksum generator, and wherein the DMA controller is configured to read DMA data for a DMA operation from the memory and provide the data to the checksum generator, and wherein the DMA controller is configured to write a checksum generated by the checksum generator to the memory, and wherein the checksum generator comprises:

an N-bit accumulator; and a plurality of N-bit 3:2 carry save adders arranged as a plurality of levels, wherein each of the plurality of levels includes at least one of the plurality of N-bit 3:2 carry save adders, and wherein a first level of the plurality of levels has inputs coupled to N-bit inputs extracted from an input to the checksum generator and the N-bit output of the accumulator, and wherein inputs at other levels of the plurality of levels are coupled to the outputs of the preceding one or more levels, and wherein a most significant bit of each carry output of a given level of the plurality of levels is inserted as a least significant bit of the input to the next level of the plurality of levels and remaining bits of the carry output are connected in more significant bit positions than the least significant bit of the input.

11. The apparatus as recited in claim 10 wherein the DMA controller is configured to write the checksum to a DMA descriptor in memory.

12. The apparatus as recited in claim 11 wherein the DMA descriptor describes the DMA operation.

13. The apparatus as recited in claim 12 wherein the DMA descriptor comprises a header portion and a data portion, and wherein the DMA controller is configured to write the checksum to the header portion of the DMA descriptor.

14. The apparatus as recited in claim 13 wherein the header portion specifies that the checksum generation is to occur during the DMA operation.

15. The apparatus as recited in claim 14 wherein the header portion further comprises a result reserve field, and wherein the DMA controller is configured to write the checksum to the result reserve field.

16. The apparatus as recited in claim 10 integrated onto a single integrated circuit.

17. The apparatus as recited in claim 10 wherein a last level of the plurality of levels comprises a first N-bit 3:2 carry save adder of the plurality of N-bit 3:2 carry save adders, wherein the first N-bit 3:2 carry save adder has inputs coupled to the outputs of a next to last level of the plurality of levels and also has one input coupled to an output from another level that is next to the next to last level.

18. The apparatus as recited in claim 17 wherein the checksum generator further comprises a full adder having inputs coupled to the outputs of the first N-bit 3:2 carry save adder and an output coupled to the input of the accumulator, wherein the most significant bit of the carry output of the first N-bit 3:2 carry save adder is inserted as the least significant bit of the input to the full adder.

19. The apparatus as recited in claim 18 wherein the full adder comprises:

a first carry generator coupled to receive the inputs of the full adder, the first carry generator having a carry-in input coupled to binary zero and a carry-out output;

a second carry generator coupled to receive the inputs of the full adder, the second carry generator having a carry-in input coupled to binary one;

a multiplexor coupled to the outputs of the first and second carry generators, wherein a selection control of the multiplexor is coupled to the carry-out output of the first carry generator;

a first exclusive OR (XOR) circuit coupled to the inputs of the full adder; and a second XOR circuit having inputs coupled to the output of the multiplexor and the output of the first XOR circuit, wherein an output of the second XOR circuit is the output of the full adder.

* * * * *

UNITED STATES PATENT AND TRADEMARK OFFICE
CERTIFICATE OF CORRECTION

PATENT NO. : 7,707,477 B2
APPLICATION NO. : 11/238382
DATED : April 27, 2010
INVENTOR(S) : Dominic Go et al.

Page 1 of 1

It is certified that error appears in the above-identified patent and that said Letters Patent is hereby corrected as shown below:

In column 15, line 6, delete "12N" and insert -- 112N --, therefor.

In column 16, line 9, delete "14M" and insert -- 114M --, therefor.

In column 16, line 11, delete "14M" and insert -- 114M --, therefor.

In column 21, line 41, delete "46)," and insert -- 40), --, therefor.

In column 22, line 42, delete "12N" and insert -- 112N --, therefor.

In column 24, line 13, delete "1112A-" and insert -- 112A --, therefor.

Signed and Sealed this
Fifteenth Day of November, 2011

David J. Kappos
*Director of the United States Patent and Trademark Office*